(12) United States Patent
Choi et al.

(10) Patent No.: US 10,985,339 B2
(45) Date of Patent: *Apr. 20, 2021

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Shinil Choi, Yongin-si (KR); Sunghoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/589,494

(22) Filed: Oct. 1, 2019

(65) Prior Publication Data

US 2020/0028112 A1 Jan. 23, 2020

Related U.S. Application Data

(63) Continuation of application No. 15/871,837, filed on Jan. 15, 2018, now Pat. No. 10,476,025.

(30) Foreign Application Priority Data

Mar. 10, 2017 (KR) .................. 10-2017-0030811

(51) Int. Cl.
*H01L 51/52* (2006.01)
*H01L 27/32* (2006.01)
(Continued)

(52) U.S. Cl.
CPC ...... *H01L 51/5228* (2013.01); *H01L 27/3211* (2013.01); *H01L 51/0023* (2013.01); *H01L 51/5225* (2013.01); *H01L 51/56* (2013.01)

(58) Field of Classification Search
CPC ... H01L 51/00; H01L 51/002; H01L 51/0023; H01L 51/32; H01L 51/321;
(Continued)

(56) References Cited

U.S. PATENT DOCUMENTS 9,899,636 B2 2/2018 Defranco et al.
10,476,025 B2 * 11/2019 Choi .................. H01L 27/3211
(Continued)

FOREIGN PATENT DOCUMENTS

KR 10-2006-0093205 8/2006
KR 10-2011-0036171 4/2011
KR 10-2014-0118023 10/2014

OTHER PUBLICATIONS

Extended European Search Report dated Jul. 3, 2018, in European Patent Application No. 18161325.8.

(Continued)

*Primary Examiner* — Monica D Harrison
(74) *Attorney, Agent, or Firm* — H.C. Park & Associates, PLC

(57) ABSTRACT

An organic light-emitting display (OLED) apparatus includes: a first electrode; a second electrode disposed separate from the first electrode; a pixel-defining layer covering an edge of the first electrode and an edge of the second electrode; a first organic functional layer disposed on the first electrode and the pixel-defining layer including a first emission layer; a first opposing electrode covering a top surface and enclosing an outer circumference of side surfaces of the first organic functional layer; a second organic functional layer disposed on the second electrode and the pixel-defining layer including a second emission layer; and (Continued)

a second opposing electrode covering a top surface and enclosing an outer circumference of side surfaces of the second organic functional layer. An area of the first opposing electrode in contact with the pixel-defining layer is greater than an area of the second opposing electrode in contact with the pixel-defining layer.

19 Claims, 26 Drawing Sheets

(51) Int. Cl.
  *H01L 51/00* (2006.01)
  *H01L 51/56* (2006.01)

(58) Field of Classification Search
  CPC ... H01L 51/3211; H01L 51/52; H01L 51/522; H01L 51/5225; H01L 51/5228; H01L 51/56; H01L 27/32; H01L 27/321; H01L 27/3211
  USPC .......................................................... 257/40
  See application file for complete search history.

(56) References Cited

U.S. PATENT DOCUMENTS

| 2015/0102305 A1 | 4/2015 | Jung et al. |
| 2015/0188098 A1 | 7/2015 | Kim et al. |
| 2016/0197297 A1 | 7/2016 | Choi |

OTHER PUBLICATIONS

Non-Final Office Action dated Mar. 7, 2019, in U.S. Appl. No. 15/871,837.
Notice of Allowance dated Jun. 20, 2019, in U.S. Appl. No. 15/871,837.

* cited by examiner

ORGANIC LIGHT-EMITTING DISPLAY APPARATUS AND METHOD OF MANUFACTURING THE SAME

CROSS REFERENCE TO RELATED APPLICATION

This application is a continuation of U.S. patent application Ser. No. 15/871,837, filed on Jan. 15, 2018, and claims priority from and the benefit of Korean Patent Application No. 10-2017-0030811, filed on Mar. 10, 2017, each of which is hereby incorporated by reference for all purposes as if fully set forth herein.

BACKGROUND

Field

Exemplary embodiments of the present invention relate to an organic light-emitting display (OLED) apparatus and a method of manufacturing the same.

Discussion of the Background

An organic light-emitting display (OLED) apparatus is a self-emitting display apparatus that includes a hole injection electrode, an electron injection electrode, and an organic emission layer between the hole injection electrode and the electron injection electrode, and emits light when holes injected from the hole injection electrode and electrons injected from the electron injection electrode recombine in the organic emission layer. The OLED apparatus has advantages such as low power consumption, high luminance, and fast response rates, and thus has received attention as a next-generation display apparatus.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

Exemplary embodiments of the present invention provide an organic light-emitting display (OLED) apparatus that may increase a resolution and reduce defects and manufacturing costs, and a method of manufacturing the OLED apparatus.

Additional features of the invention will be set forth in the description which follows, and in part will be apparent from the description, or may be learned by practice of the invention.

An exemplary embodiment of the present invention discloses an organic light-emitting display (OLED) apparatus including: a first electrode; a first organic functional layer disposed on the first electrode, the first organic functional layer including a first emission layer; a first opposing electrode covering a top surface and side surfaces of the first organic functional layer; a second electrode disposed separate from the first electrode; a second organic functional layer disposed on the second electrode, the second organic functional layer including a second emission layer; and a second opposing electrode covering a top surface and side surfaces of the second organic functional layer, wherein a lateral thickness of the first opposing electrode covering the side surfaces of the first organic functional layer may be greater than a lateral thickness of the second opposing electrode covering the side surfaces of the second organic functional layer.

A first color of light emitted from the first emission layer may be different from a second color of light emitted from the second emission layer.

Each of the first organic functional layer and the second organic functional layer may include at least one layer selected from the group consisting of a hole injection layer, a hole transport layer, an electron injection layer, and an electron transport layer.

A thickness of a portion of the first opposing electrode covering the top surface of the first organic functional layer may be as same as a thickness of a portion of the second opposing electrode covering the top surface of the second organic functional layer.

The OLED apparatus may further include a pixel-defining layer including an insulating layer, the pixel-defining layer covering an edge of the first electrode and an edge of the second electrode.

An edge of the first organic functional layer and an edge of the second organic functional layer may be disposed on an inclined surface of the pixel-defining layer.

The OLED apparatus may further include a common electrode that is commonly and integrally disposed on the first opposing electrode and the second opposing electrode.

The common electrode may cover side surfaces of the first opposing electrode and side surfaces of the second opposing electrode.

The OLED apparatus may further include: a third electrode disposed separate from the first electrode and the second electrode; a third organic functional layer disposed on the third electrode, the third organic functional layer including a third emission layer; and a third opposing electrode covering a top surface and side surfaces of the third organic functional layer, wherein the lateral thickness of the second opposing electrode covering the side surfaces of the second organic functional layer is greater than a lateral thickness of the third opposing electrode covering the side surfaces of the third organic functional layer.

A first color of light emitted from the first emission layer, a second color of light emitted from the second emission layer, and a third color of light emitted from the third emission layer may be different from one another.

An exemplary embodiment of the present invention also discloses an organic light-emitting display (OLED) apparatus including: a first electrode; a first organic functional layer disposed on the first electrode, the first organic functional layer including a first emission layer; a first opposing electrode covering a top surface and side surfaces of the first organic functional layer; a second electrode disposed separate from the first electrode; a second organic functional layer disposed on the second electrode, the second organic functional layer including a second emission layer; and a second opposing electrode covering a top surface and side surfaces of the second organic functional layer, wherein an area of the first opposing electrode in plan view may be greater than an area of the second opposing electrode in plan view.

The first opposing electrode may include a first conductive layer covering the top surface of the first organic functional layer, a second conductive layer surrounding the side surfaces of the first organic functional layer, a fourth conductive layer surrounding side surfaces of the second conductive layer, and a sixth conductive layer surrounding side surfaces of the fourth conductive layer, and wherein the second opposing electrode may include a third conductive layer covering the top surface of the second organic functional layer, the fourth conductive layer surrounding the side surfaces of the second organic functional layer, and the sixth conductive layer surrounding the side surfaces of the fourth conductive layer.

An exemplary embodiment of the present invention also discloses a method of manufacturing an organic light-emitting display (OLED) apparatus, including: disposing a first electrode and a second electrode separate from each other on a substrate; sequentially disposing a first organic functional layer and a first conductive layer over the first electrode; patterning the first organic functional layer and the first conductive layer such that side surfaces of the first organic functional layer and side surfaces of the first conductive layer are exposed; disposing a second conductive layer; patterning the second conductive layer such that the second conductive layer covers the side surfaces of the first organic functional layer and the side surfaces of the first conductive layer; sequentially disposing a second organic functional layer and a third conductive layer over the first conductive layer, the second conductive layer, and the second electrode; patterning the second organic functional layer and the third conductive layer such that side surfaces of the second organic functional layer and side surfaces of the third conductive layer are exposed; disposing a fourth conductive layer; and patterning the fourth conductive layer such that the fourth conductive layer covers the side surfaces of the second organic functional layer, side surfaces of the second conductive layer, and the side surfaces of the third conductive layer.

The patterning the second conductive layer and the patterning the fourth conductive layer may include a dry etching method.

The patterning of the first organic functional layer and the first conductive layer may include: disposing a first photoresist on the first conductive layer; removing a second portion of the first photoresist such that a first portion of the first photoresist is formed at a location corresponding to the first electrode; removing the first organic functional layer and the first conductive layer at a location corresponding to the second portion; and removing the first portion of the first photoresist.

Removing the first organic functional layer and the first conductive layer may include a dry etching method.

The dry etching method may include: a first process of dry-etching the first conductive layer; and a second process of dry-etching the second organic functional layer.

The sequentially disposing the first organic functional layer and the first conductive layer, the disposing the second conductive layer, the sequentially disposing the second organic functional layer and the third conductive layer, and the disposing the fourth conductive layer may include a deposition process.

The disposing the first electrode and the second electrode may include: disposing an insulating layer to cover an edge of the first electrode and an edge of the second electrode.

The method of manufacturing the OLED apparatus may further include: disposing a common electrode on the first conductive layer, the second conductive layer, the third conductive layer, and the fourth conductive layer, wherein the common electrode may be commonly and integrally formed.

The first organic functional layer and the second organic functional layer respectively may include a first emission layer and a second emission layer which emit light of different colors.

The disposing the first electrode and the second electrode may include: disposing, on the substrate, a third electrode separate from the first electrode and the second electrode; and the method further including: sequentially disposing a third organic functional layer and a fifth conductive layer on the first conductive layer, the second conductive layer, the third conductive layer, the fourth conductive layer, and the third electrode; patterning the third organic functional layer and a fifth conductive layer such that side surfaces of the third organic functional layer and side surfaces of the fifth conductive layer are exposed; disposing a sixth conductive layer; and patterning the sixth conductive layer covering the side surfaces of the third organic functional layer, the side surfaces of the second conductive layer, side surfaces of the fourth conductive layer, and the side surfaces of the fifth conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
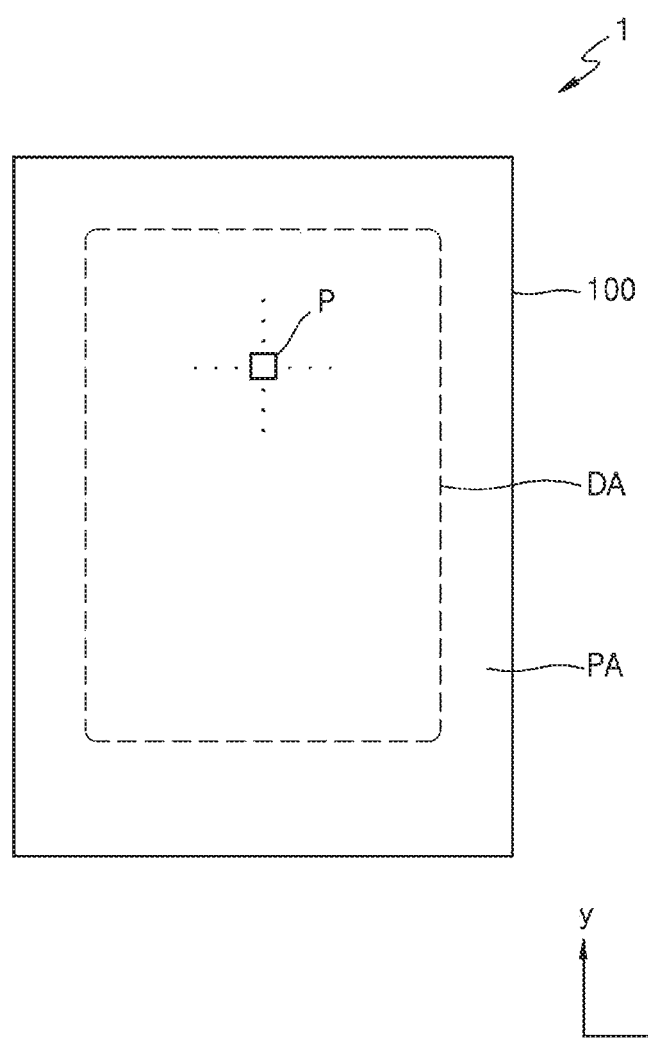
FIG. 1 is a schematic plan view of an organic light-emitting display (OLED) apparatus according to a first embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Figure 2:
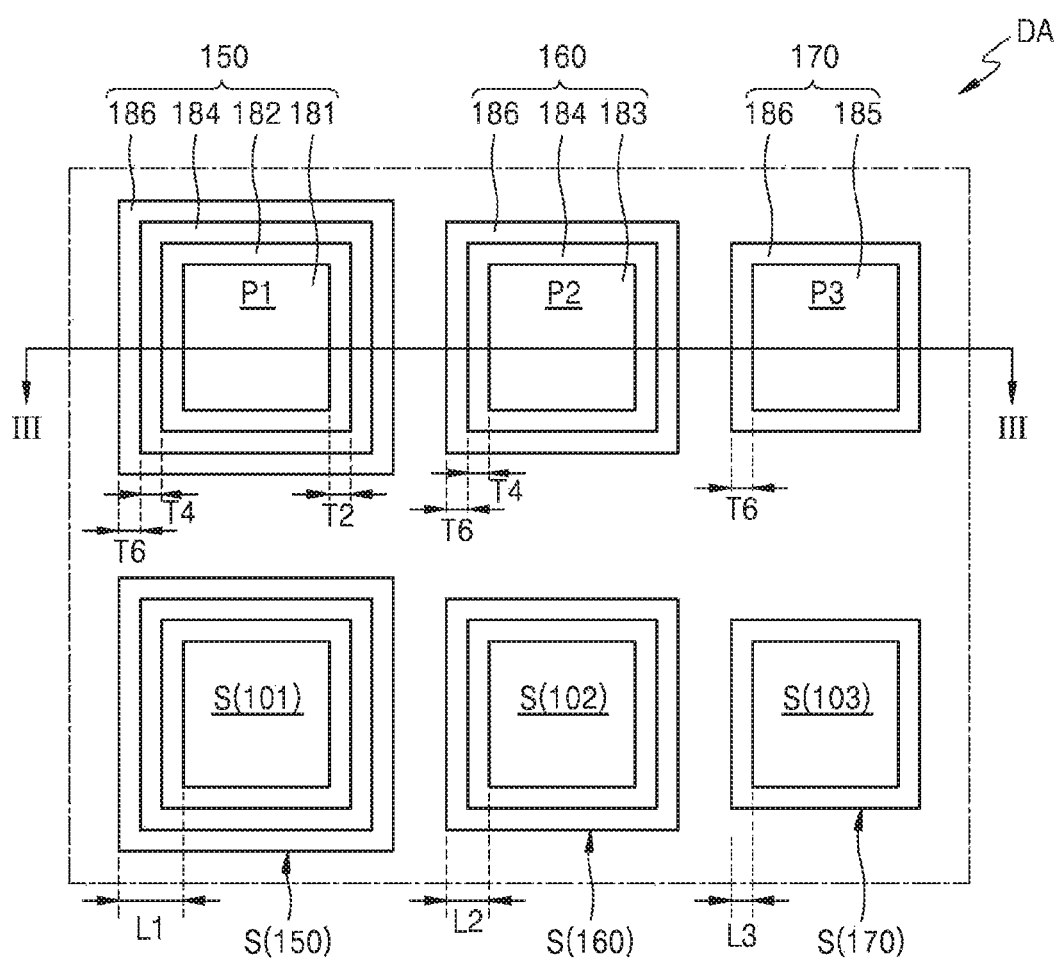
FIG. 2 is a plan view illustrating a portion of a display area of the OLED apparatus as illustrated in FIG. 1.
Figure 3:
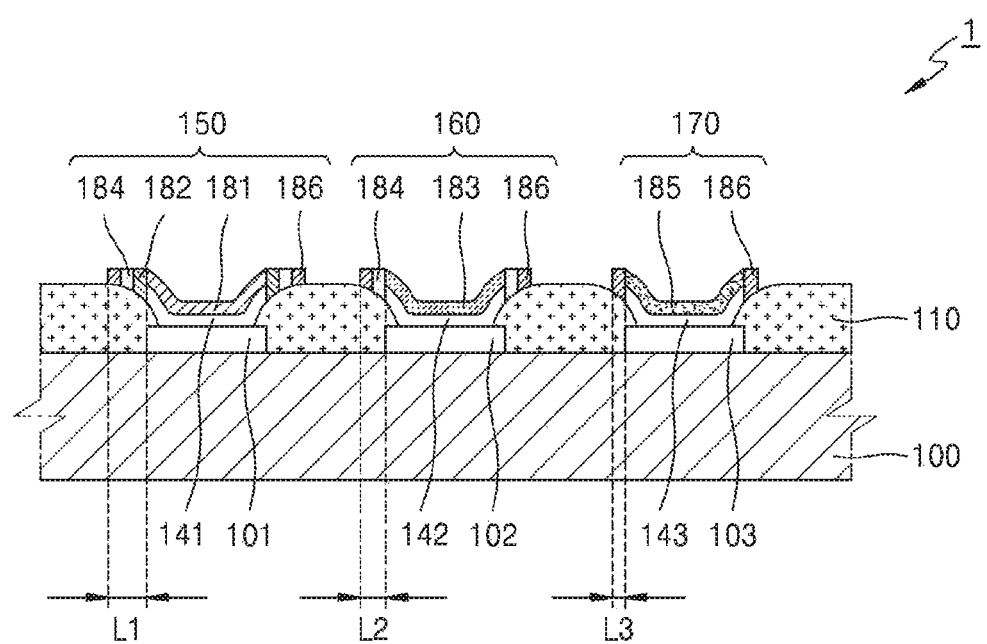
FIG. 3 is a cross-sectional view of the OLED apparatus according to the first embodiment, taken along a line of FIG. 2.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein FIG. 1 is a schematic plan view of an organic light-emitting display (OLED) apparatus 1 according to a first embodiment. FIG. 2 is a plan view illustrating a portion of a display area DA of the OLED apparatus as illustrated in FIG. 1. FIG. 3 is a cross-sectional view of the OLED apparatus 1 of FIG. 1, taken along a line of FIG. 2.

Referring to FIG. 1, the OLED apparatus 1 includes a substrate 100. The substrate 100 includes a display area DA and a peripheral area PA outside the display area DA.

In the display area DA of the substrate 100, pixels P including organic light-emitting devices (OLED) may be arranged. The peripheral area PA of the substrate 100 is an area where an image is not implemented and various wires for transmitting electrical signals to the display area DA are located in the peripheral area PA.

Referring to FIGS. 2 and 3, the display area DA includes pixels P1, P2, and P3 emitting light of different colors. Hereinafter, for convenience, the pixels P1, P2, and P3 emitting light of different colors are referred to as a first pixel P1, a second pixel P2, and a third pixel P3.

According to an exemplary embodiment, the first pixel P1 emits red light, the second pixel P2 emits green light, and the third pixel P3 emits blue light. In the present exemplary embodiment, three pixels, that is, the first, second, and third pixels P1, P2, and P3, are arranged in the display area DA. However, the exemplary embodiments are not limited thereto. in an exemplary embodiment, the display area DA may further include a fourth pixel (not shown) emitting white light in addition to the first, second, and third pixels P1, P2, and P3.

A first anode (or a first electrode) 101, a second anode (or a second electrode) 102, and a third anode (or a third electrode) 103 are respectively disposed in the first, second, and third pixels P1, P2, and P3 on the substrate 100 and are spaced apart from each other.

A pixel-defining layer 110 covers end portions of the first, second, and third anodes 101, 102, and 103.

A first organic functional layer 141 including a first emission layer, a second organic functional layer 142 including a second emission layer, and a third organic functional layer 143 including a third emission layer are respectively disposed on the first, second, and third anodes 101, 102, and 103. A first auxiliary cathode (or a first opposing electrode) 150, a second auxiliary cathode 160 (or a second opposing electrode), and a third auxiliary cathode 170 (or a third opposing electrode) are respectively disposed on the first, second, and third organic functional layers 141, 142, and 143.

The first auxiliary cathode 150 includes a first conductive layer 181 disposed on the first organic functional layer 141, a second conductive layer 182 covering side surfaces of the first organic functional layer 141, a fourth conductive layer 184 covering side surfaces of the second conductive layer 182, and a sixth conductive layer 186 covering side surfaces of the fourth conductive layer 184. Thus, an area S(150) of the first auxiliary cathode 150 is greater than an area S(101) of the first anode 101 in the plan view.

The second auxiliary cathode 160 includes a third conductive layer 183 disposed on the second organic functional layer 142, the fourth conductive layer 184 covering side surfaces of the second organic functional layer 142, and the sixth conductive layer 186 covering side surfaces of the fourth conductive layer 184. Thus, an area S(160) of the second auxiliary cathode 160 is greater than an area S(102) of the second anode 102 in the plan view.

The third auxiliary cathode 170 includes a fifth conductive layer 185 disposed on the third organic functional layer 143, and the sixth conductive layer 186 covering side surfaces of the third organic functional layer 143. Thus, an area S(170) of the third auxiliary cathode 170 is greater than an area S(103) of the third anode 103 in the plan view.

First, second, third, fourth, fifth, and sixth conductive layers 181, 182, 183, 184, 815, and 186 may include metallic materials.

A sum of a lateral thickness T2 of the second conductive layer 182, a lateral thickness T4 of the fourth conductive layer 184, and a lateral thickness T6 of the sixth conductive layer 186 is a lateral thickness L1 of the first auxiliary cathode 150. A sum of the lateral thickness T4 of the fourth conductive layer 184 and the lateral thickness T6 of the sixth conductive layer 186 is a lateral thickness L2 of the second auxiliary cathode 160. The lateral thickness T6 of the sixth conductive layer 186 is equal to a lateral thickness L3 of the third auxiliary cathode 170. That is, the lateral thickness L1 of a portion of the first auxiliary cathode 150 disposed on a side surface of the first organic functional layer 141 is greater than the lateral thickness L2 of a portion of the second auxiliary cathode 160 disposed on a side surface of the second organic functional layer 142. The lateral thickness L2 of a portion of the second auxiliary cathode 160 disposed on the side surface of the second organic functional layer 142 is greater than the lateral thickness L3 of a portion of the third auxiliary cathode 170 disposed on a side surface of the third organic functional layer 143.

With reference to FIGS. 4, 5, 6A, 6B, 6C, 6D, 6E, 6F, 6G, 7A, 7B, 7C, 7D, 7E, 7F, 7G, 8A, 8B, 8C, 8D, 8E, 8F, and 8G, a method of manufacturing the OLED apparatus 1 according to the present exemplary embodiment and the OLED apparatus 1 manufactured by the above method are described in more detail.

Figure 4:
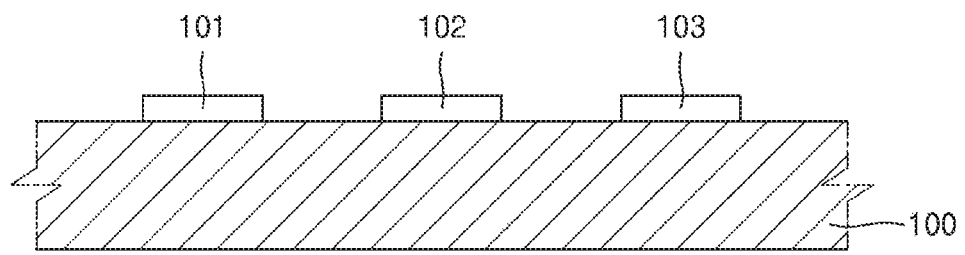
FIG. 4 is a schematic cross-sectional view for explaining an exemplary operation of forming a plurality of anodes on a substrate of the OLED apparatus according to the first embodiment.
Figure 5:
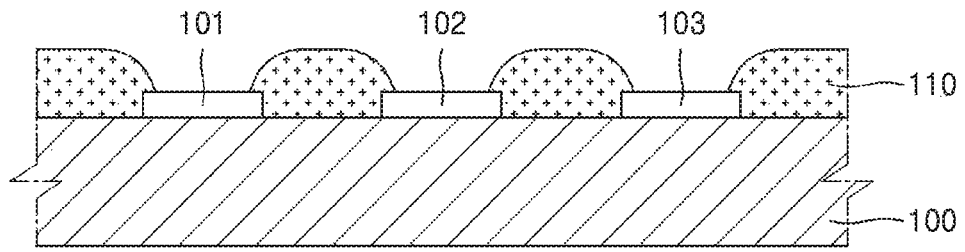
FIG. 5 is a schematic cross-sectional view for explaining an exemplary operation of forming a pixel-defining layer in the OLED apparatus according to the first embodiment.

FIG. 4 is a schematic cross-sectional view for explaining an operation of forming the first, second, and third anodes 101, 102, and 103 on the substrate 100 of the OLED apparatus 1 according to the first embodiment. FIG. 5 is a schematic cross-sectional view for explaining an operation of forming a pixel-defining layer in the OLED apparatus 1 according to the first embodiment. FIGS. 6A to 6G are schematic cross-sectional views for explaining a first unit process of the OLED apparatus 1 according to the first embodiment. FIGS. 7A to 7G are schematic cross-sectional views for explaining a second unit process of the OLED apparatus 1 according to the first embodiment. FIGS. 8A to 8G are schematic cross-sectional views for explaining a third unit process of the OLED apparatus 1 according to the first embodiment.

Referring to FIG. 4, the first anode 101, the second anode 102, and the third anode 103 are formed on the substrate 100.

The substrate 100 may include various materials. For example, the substrate 100 may include glass or plastic. Examples of the plastic may include materials having excellent heat resistance and excellent durability such as polyimide, polyethylene naphthalate, polyethylene terephthalate, polyarylate, polycarbonate, polyetherimide, and polyethersulfone.

Additionally, a buffer layer for planarizing a top surface of the substrate 100 and preventing or reducing penetration of impurities may be further formed over the substrate 100. For example, the buffer layer may be a layer or layers including silicon nitride, silicon oxide, and/or the like.

The first, second, and third anodes 101, 102, and 103 may be hole injection electrodes and include materials having a high work function. The first, second, and third anodes 101, 102, and 103 may each include a transparent conductive oxide component. For example, the first, second, and third anodes 101, 102, and 103 may include at least one of indium tin oxide, indium zinc oxide, zinc oxide, indium oxide, indium gallium oxide, and aluminum zinc oxide. Also, the first, second, and third anodes 101, 102, and 103 may each be a layer or layers including a metal such as silver (Ag), aluminum (Al), magnesium (Mg), lithium (Li), or calcium (Ca) and/or an alloy.

The first, second, and third anodes 101, 102, and 103 electrically contact first, second, and third thin-film transistors, respectively, wherein the first, second, and third thin-film transistors are disposed between the substrate 100 and the first, second, and third anodes 101, 102, and 103.

Referring to FIG. 5, the pixel-defining layer 110 surrounding edges of the first anode 101, the second anode 102, and the third anode 103 is formed on the substrate 100.

Since edges of the first, second, and third anodes 101, 102, and 103 are sharp, when a current is applied after the first, second, and third auxiliary cathodes 150, 160, and 170 are formed, an electric field may be concentrated in the edges of the first, second, and third anodes 101, 102 and 103, and thus an electrical short circuit may occur during operation. However, in the present exemplary embodiment, the end portions of the first, second, and third anodes 101, 102, and 103 are covered by the pixel-defining layer 110, and thus an electric field may be prevented or reduced from concentrating in the end portions of the first, second, and third anodes 101, 102, and 103.

The pixel-defining layer 110 may be an organic insulating layer including, for example, a general-purpose polymer such as poly(methyl methacrylate) (PMMA) or polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a combination thereof.

Figure 6A:
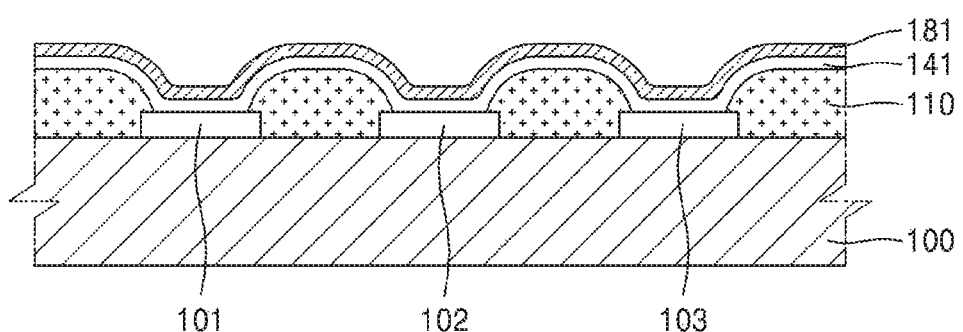
FIGS. 6A, 6B, 6C, 6D, 6E, 6F, and 6G are schematic cross-sectional views for explaining a first unit process of forming the OLED apparatus according to the first embodiment.

Referring to FIG. 6A, the first organic functional layer 141 and the first conductive layer 181 are sequentially deposited on the substrate 100 on which the first, second, and third anodes 101, 102, and 103 are formed.

The first organic functional layer 141 includes a first organic emission layer. Also, the first organic functional layer 141 may further include at least one functional layer including a hole injection layer, a hole transport layer, an electron transport layer, and an electron injection layer.

The first organic functional layer 141 may be formed by a vacuum deposition method. During a deposition process, the first organic functional layer 141 is formed on top surfaces of the first, second, and third anodes 101, 102, and 103 and on the pixel-defining layer 110.

The first conductive layer 181 may be formed on the first organic functional layer 141 by a vacuum deposition method. The first conductive layer 181 may include Ag, Mg, Al, platinum (Pt), palladium (Pd), gold (Au), nickel (Ni), neodymium (Nd), iridium (Ir), chromium (Cr), Li, Ca, or an alloy thereof. The first conductive layer 181 may also include a transparent conductive material.

Figure 6B:
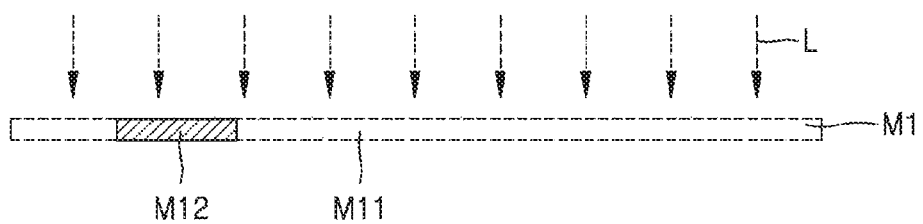
Figure 6B:
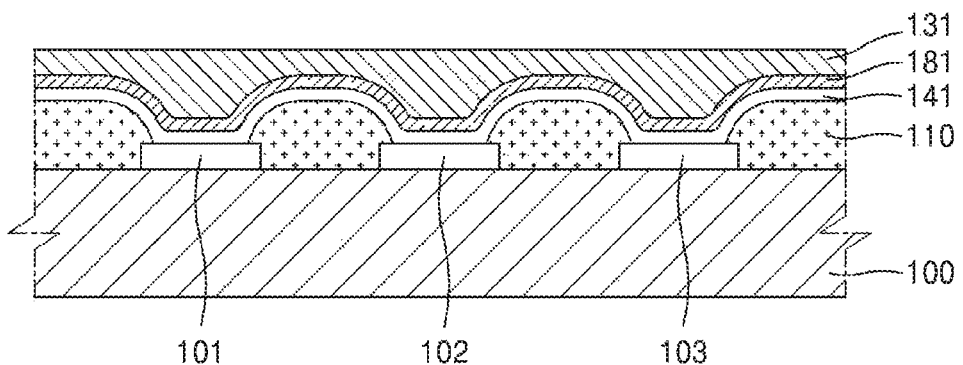

Referring to FIG. 6B, a first photoresist 131 is disposed on the first conductive layer 181. The first photoresist 131 is exposed to light using a first photomask M1 including an area M11 through which light L passes and an area M12 where light L is blocked.

Figure 6C:
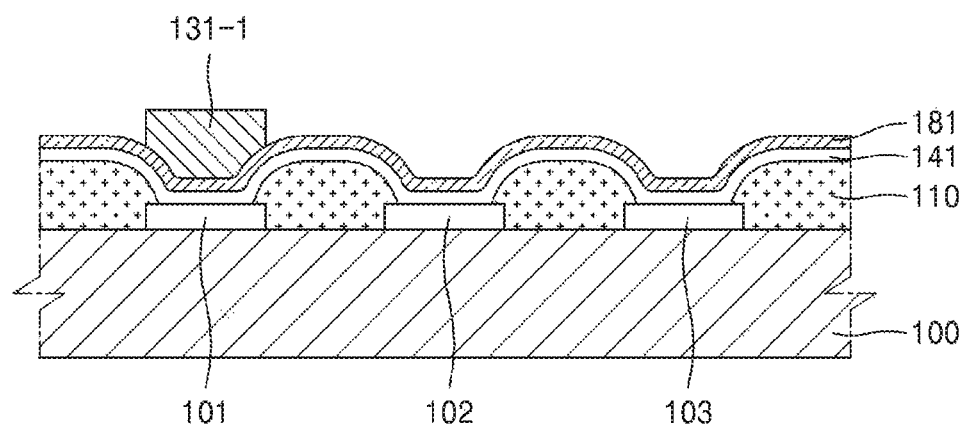

Referring to FIG. 6C, the first photoresist 131 is developed. The first photoresist 131 may be either a positive type or a negative type. In the present exemplary embodiment, the first photoresist 131 is a positive type. A first portion 131-1 of the developed first photoresist 131, which corresponds to the first anode 101, is formed as a pattern, and the rest of the first photoresist 131 is removed.

Figure 6D:
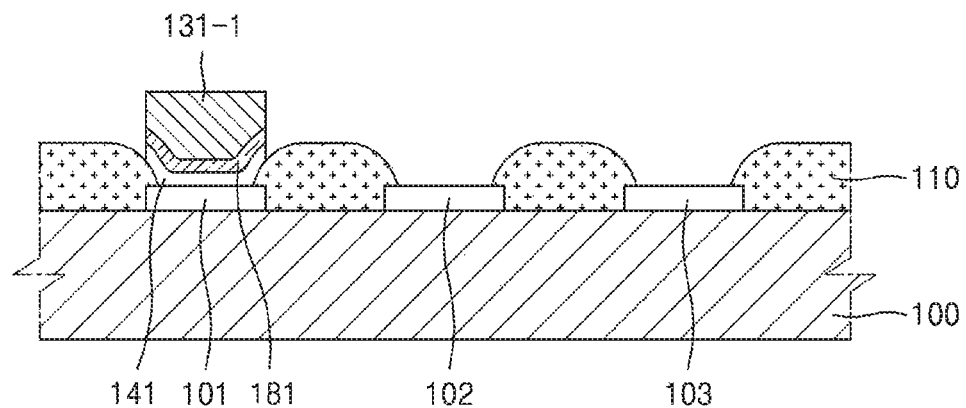

Referring to FIG. 6D, the first portion 131-1 of the first photoresist 131 of FIG. 6C is used as an etch mask, and the first organic functional layer 141 and the first conductive layer 181 are etched and patterned.

The first organic functional layer 141 and the first conductive layer 181 may be etched by a dry etching process. The dry etching process may be respectively performed on the first organic functional layer 141 and the first conductive layer 181. For example, the first conductive layer 181 may be dry-etched by using a gas including fluorine F or chlorine Cl, and then the first organic functional layer 141 may be dry-etched by using oxygen gas.

Figure 6E:
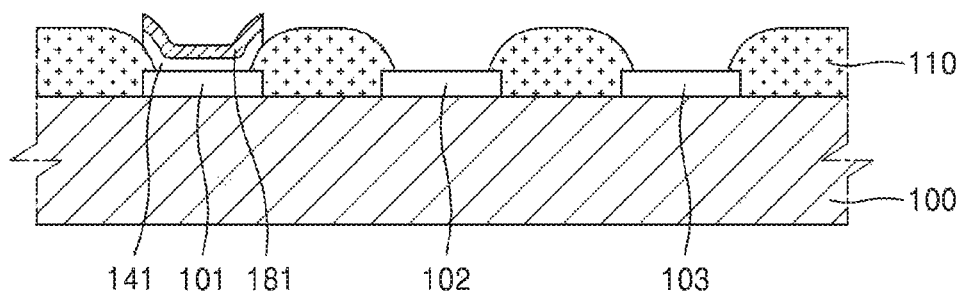

Referring to FIG. 6E, the first portion 131-1 (see FIG. 6D) of the first photoresist 131 is removed. The first portion 131-1 of the first photoresist 131 may be removed by a dry process such as ashing or stripping.

As the first portion 131-1 of the first photoresist 131 is removed, the first organic functional layer 141 and the first conductive layer 181 are formed as patterns over the first anode 101.

Figure 6F:
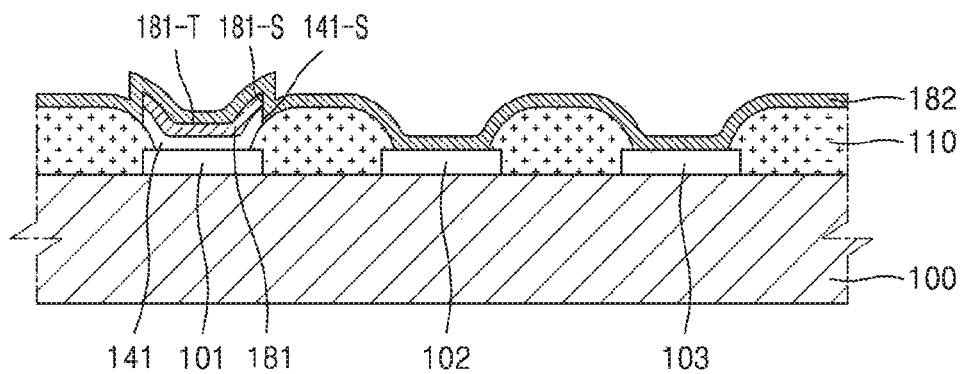

Referring to FIG. 6F, the second conductive layer 182 is deposited on the structure illustrated in FIG. 6E.

The second conductive layer 182 may include the same material as or a different material from the above-described first conductive layer 181. The second conductive layer 182 covers a top surface 181-T of the first conductive layer 181 as well as side surfaces 141-S of the first organic functional layer 141 and side surfaces 181-S of the first conductive layer 181.

Figure 6G:
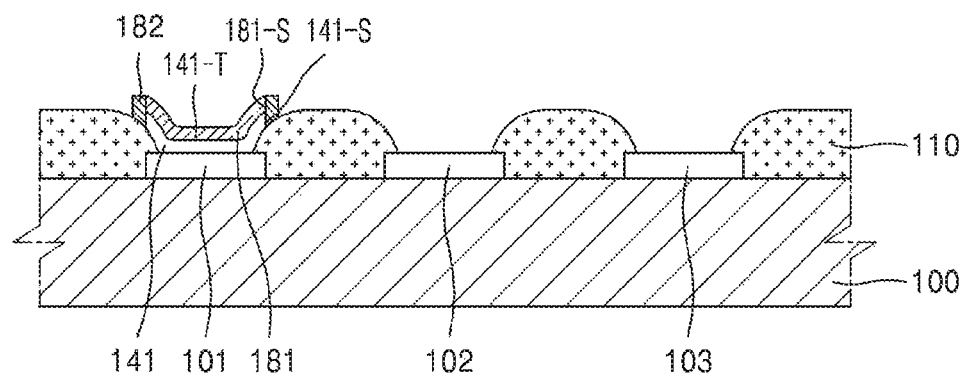

Referring to FIG. 6G, the second conductive layer 182 is patterned such that portions of the second conductive layer 182, which cover the side surfaces 141-S of the first organic functional layer 141 and the side surfaces 181-S of the first conductive layer 181, is formed at a location corresponding to the first anode 101, and the rest of the second conductive layer 182 is removed.

The second conductive layer 182 may be patterned by a dry etching method. The second conductive layer 182 may be dry-etched by using a gas including F or Cl. By performing the dry etching method which does not use a solvent, damage to a solvent of the first organic functional layer 141 may be prevented or reduced, and by performing anisotropic etching, the second conductive layer 182 may only be disposed along the side surfaces 181-S of the first conductive layer 181, without increasing a thickness of the first conductive layer 181 from the top surface 181-T thereof.

Also, the top surface 141-T of the first organic functional layer 141 is covered by the first conductive layer 181, and the side surfaces 141-S thereof are surrounded by the second conductive layer 182, thereby preventing or reducing deterioration of the first organic functional layer 141 which may be caused by a subsequent process.

After the first unit process is performed, the second unit process for forming the second organic functional layer 142 is performed at a location where the second anode 102 is disposed, the second organic functional layer 142 emitting light of a different color from the first organic functional layer 141. Hereinafter, the second unit process is described with reference to FIGS. 7A, 7B, 7C, 7D, 7E, 7F, and 7G.

Figure 7A:
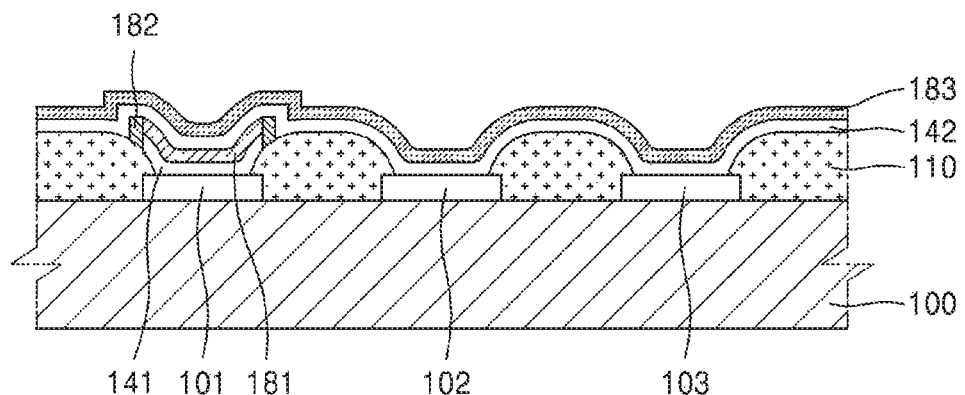
FIGS. 7A, 7B, 7C, 7D, 7E, 7F, and 7G are schematic cross-sectional views for explaining a second unit process of forming the OLED apparatus according to the first embodiment.

Referring to FIG. 7A, the second organic functional layer 142 and the third conductive layer 183 are sequentially deposited on the structure illustrated in FIG. 6G.

The second organic functional layer 142 may include a second organic emission layer that emits light of a different color from the first organic emission layer. Also, the second organic functional layer 142 may further include at least one functional layer including a hole injection layer, a hole transport layer, an electron transport layer, and an electron injection layer. The second organic functional layer 142 may be formed by a vacuum deposition method.

The third conductive layer 183 may be formed on the second organic functional layer 142 by a vacuum deposition method. The third conductive layer 183 may include the same material as or a different material from the first conductive layer 181. The third conductive layer 183 may also include the same material as or a different material from the second conductive layer 182.

Figure 7B:
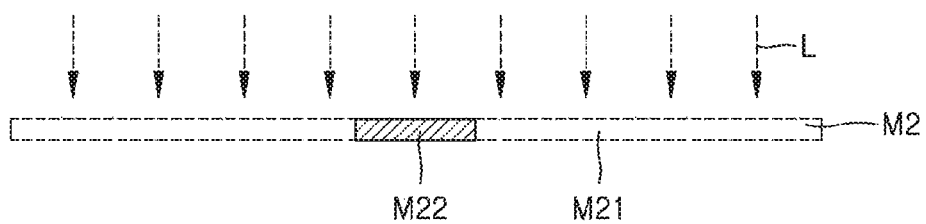
Figure 7B:
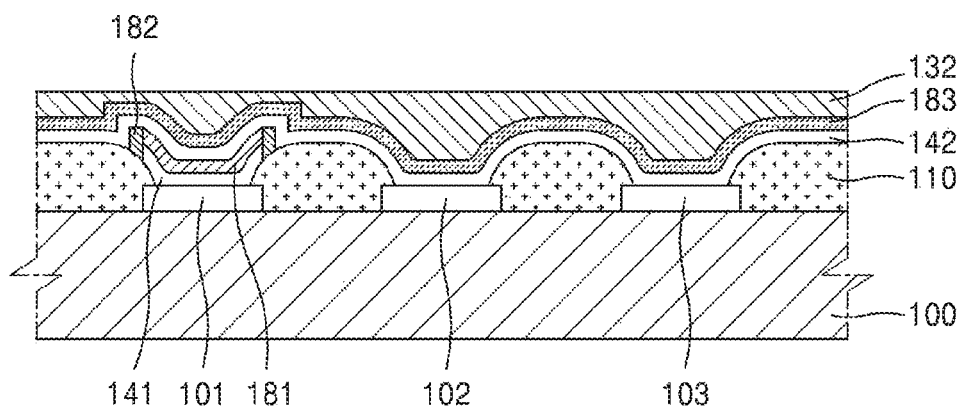

Referring to FIG. 7B, a second photoresist 132 is disposed on the third conductive layer 183. The second photoresist 132 is exposed to light using a second photomask M2 including an area M21 through which light L passes and an area M22 where light L is blocked.

Figure 7C:
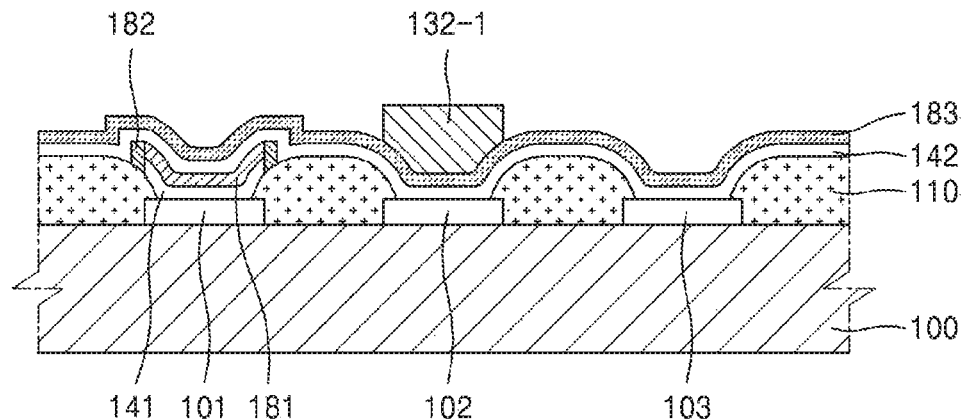

Referring to FIG. 7C, the second photoresist 132 is developed. The second photoresist 132 may be either a positive type or a negative type. In the present exemplary embodiment, the second photoresist 132 is a positive type. A first portion 132-1 of the developed second photoresist 132 is formed as a pattern and corresponds to the second anode 102. The rest of the second photoresist 132 is removed.

Figure 7D:
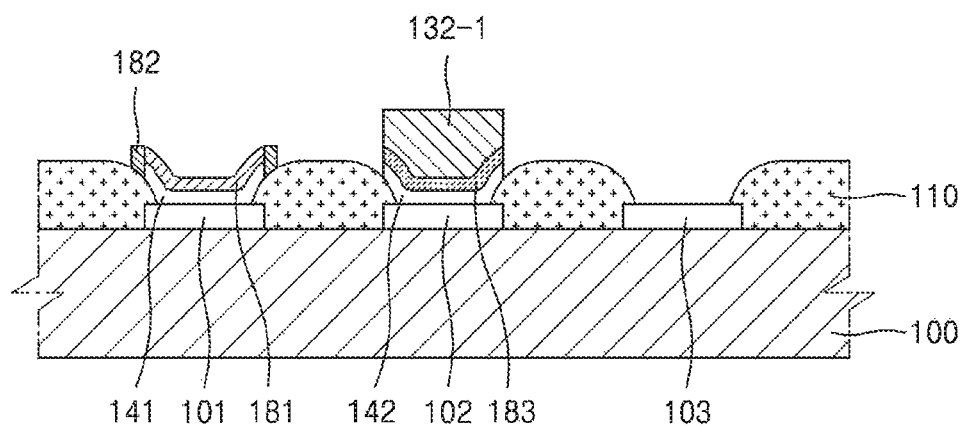

Referring to FIG. 7D, the second organic functional layer 142 and the third conductive layer 183 are etched and patterned by using the first portion 132-1 of the second photoresist 132 of FIG. 7C as an etch mask.

The second organic functional layer 142 and the third conductive layer 183 may be etched by a dry etching process. The dry etching process may be respectively performed on the second organic functional layer 142 and the third conductive layer 183. For example, the third conductive layer 183 may be dry-etched by using a gas including F or Cl, and then the second organic functional layer 142 may be dry-etched by using oxygen gas.

Figure 7E:
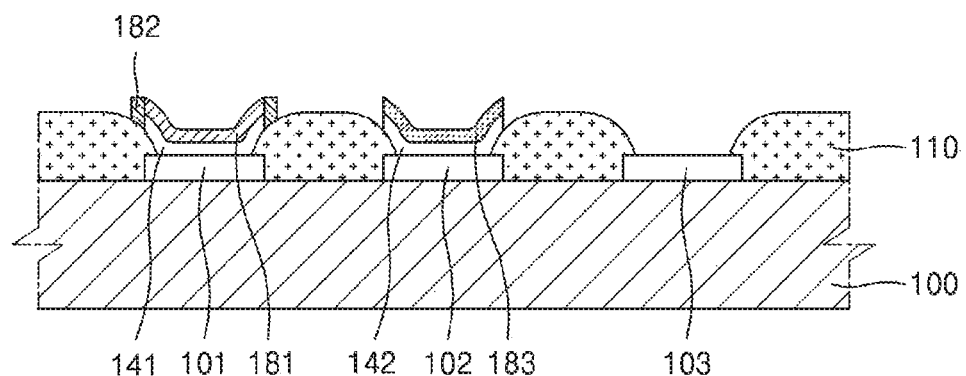

Referring to FIG. 7E, the first portion 132-1 (see FIG. 7D) of the second photoresist 132 is removed. The first portion 132-1 of the second photoresist 132 may be removed by a dry process such as ashing or stripping.

As the first portion 132-1 of the second photoresist 132 is removed, the second organic functional layer 142 and the third conductive layer 183 are formed as patterns over the second anode 102.

Figure 7F:
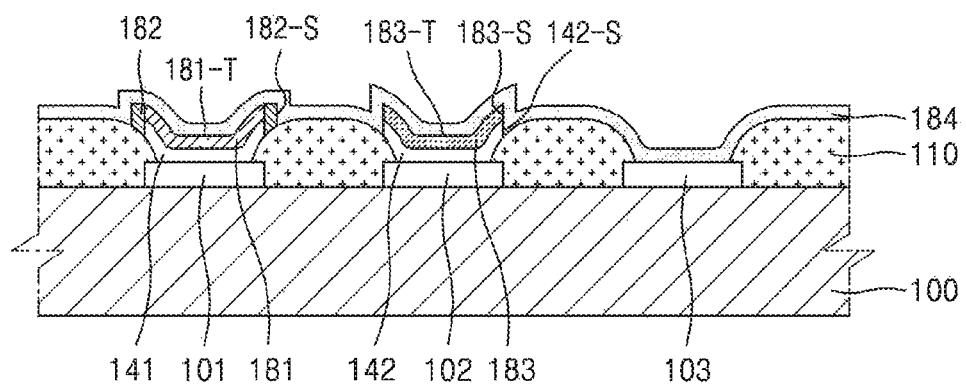

Referring to FIG. 7F, the fourth conductive layer 184 is deposited on the structure illustrated in FIG. 7E.

The fourth conductive layer 184 may include the same material as or a different material from the above-described third conductive layer 183. The fourth conductive layer 184 covers a top surface 183-T of the third conductive layer 183 over the second anode 102 as well as side surfaces 142-S of the second organic functional layer 142 and side surfaces 183-S of the third conductive layer 183.

The fourth conductive layer 184 covers the top surface 181-T of the first conductive layer 181 over the first anode 101 as well as the side surfaces 182-S of the second conductive layer 182.

Figure 7G:
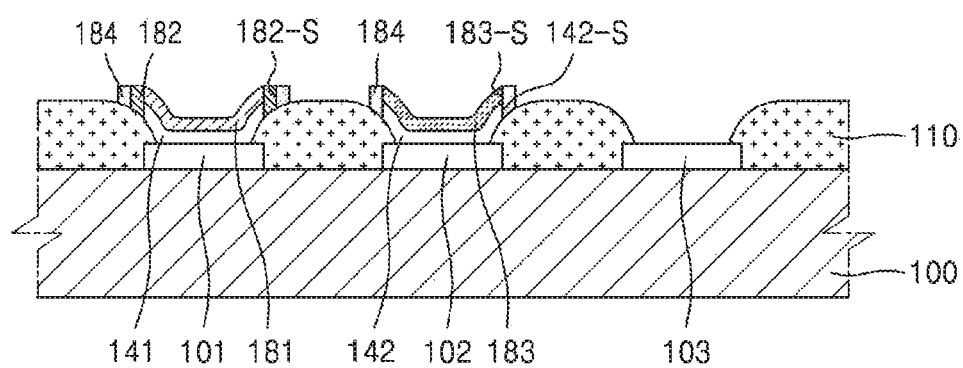

Referring to FIG. 7G, the fourth conductive layer 184 is patterned such that portions of the fourth conductive layer 184, which cover the side surfaces 182-S of the second conductive layer 182, are formed at a location corresponding to the first anode 101, portions of the fourth conductive layer 184, which cover the side surfaces 142-S of the second organic functional layer 142 and the side surfaces 183-S of the third conductive layer 183, are formed at a location corresponding to the second anode 102, and the rest of the fourth conductive layer 184 is removed.

The fourth conductive layer 184 is patterned by a dry etching method. The fourth conductive layer 184 may be dry-etched by using a gas including F or Cl. By performing the dry etching method which does not use a solvent, damage to a solvent of the second organic functional layer 142 may be prevented or reduced, and by performing anisotropic etching, the fourth conductive layer 184 may only be disposed along the side surfaces 182-S of the second conductive layer 182 and the side surfaces 183-S of the third conductive layer 183, without increasing respective thicknesses of the first conductive layer 181 and the third conductive layer 183 from the top surfaces 181-T and 183-T thereof.

Also, a top surface of the second organic functional layer 142 is covered by the third conductive layer 183, and the side surfaces 142-S of the second organic functional layer 142 are surrounded by the fourth conductive layer 184, thereby preventing or reducing deterioration of the second organic functional layer 142 which may be caused by a subsequent process.

After the above-described second unit process is performed, a third unit process of forming the third organic functional layer 143 is performed at a location where the third anode 103 is disposed, wherein the third organic functional layer 143 emits light of a different color from the first organic functional layer 141 and the second organic functional layer 142. The third unit process is described with reference to FIGS. 8A to 8G.

Figure 8A:
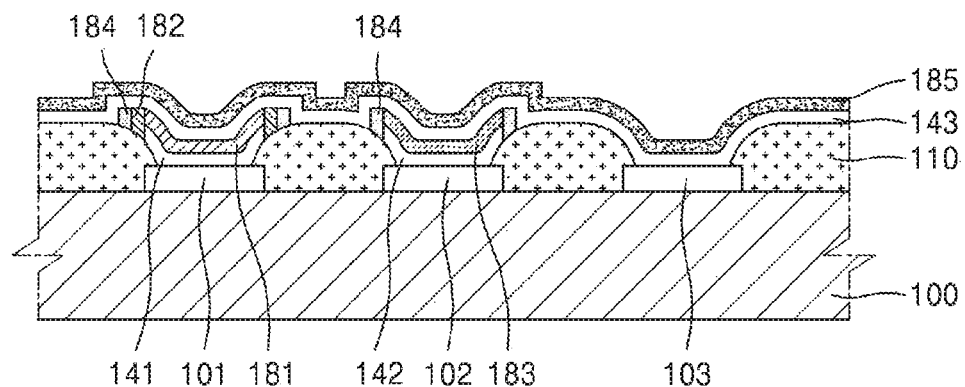
FIGS. 8A, 8B, 8C, 8D, 8E, 8F, and 8G are schematic cross-sectional views for explaining a third unit process of forming the OLED apparatus according to the first embodiment.

Referring to FIG. 8A, the third organic functional layer 143 and the fifth conductive layer 185 are sequentially deposited on the structure illustrated in FIG. 7G.

The third organic functional layer 143 may include a third organic emission layer that emits light of a different color from the first emission layer (not shown) and the second emission layer. The third organic functional layer 143 may further include at least one functional layer including a hole injection layer, a hole transport layer, an electron transport layer, and an electron injection layer. The third organic functional layer 143 may be formed by a vacuum deposition method.

The fifth conductive layer 185 may be formed on the third organic functional layer 143 by a vacuum deposition method. The fifth conductive layer 185 may include the same material as or a different material from the third conductive layer 183. Also, the fifth conductive layer 185 may include the same material as or a different material from the fourth conductive layer 184.

Figure 8B:
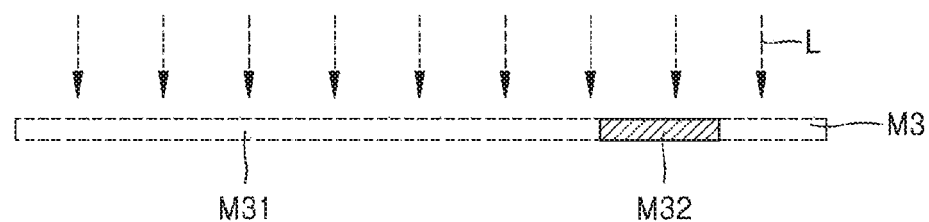
Figure 8B:
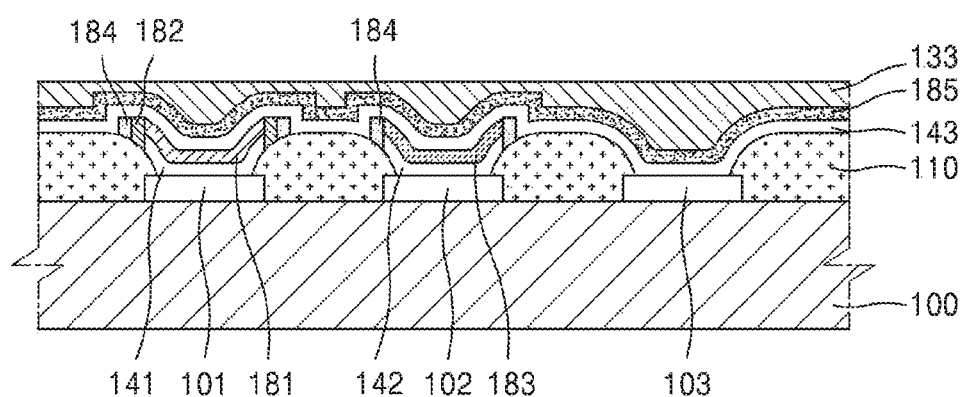

Referring to FIG. 8B, a third photoresist 133 is disposed on the fifth conductive layer 185. The third photoresist 133 is exposed to light using a third photomask M3 including an area M31 through which light L passes and an area M32 where light L is blocked.

Figure 8C:
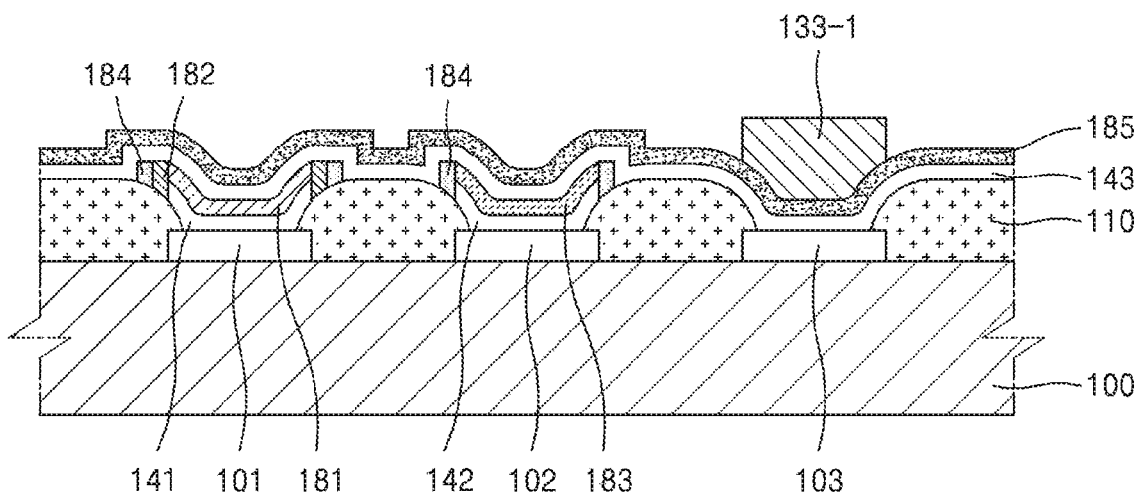

Referring to FIG. 8C, the third photoresist 133 is developed. The third photoresist 133 may be of either a positive type or a negative type. In the present embodiment, the third photoresist 133 is of a positive type. A first portion 133-1 of the developed third photoresist 133 is formed as a pattern at a location corresponding to the third anode 103, and the rest thereof is removed.

Figure 8D:
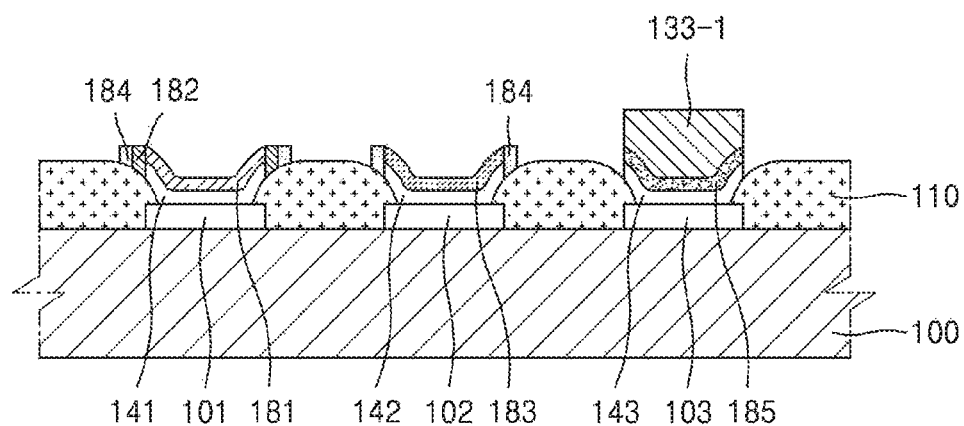

Referring to FIG. 8D, the third organic functional layer 143 and the fifth conductive layer 185 are etched and then patterned using the first portion 133-1 of the third photoresist 133 of FIG. 8C as an etch mask.

The third organic functional layer 143 and the fifth conductive layer 185 may be etched by a dry etching process. The dry etching process may be respectively performed on the third organic functional layer 143 and the fifth conductive layer 185. For example, after the fifth conductive layer 185 is dry-etched by using a gas including F or Cl, the third organic functional layer 143 may be dry-etched by using oxygen gas.

Figure 8E:
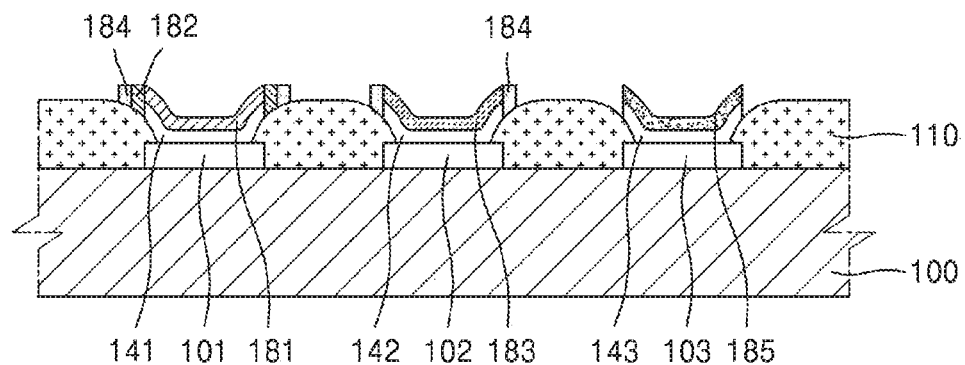

Referring to FIG. 8E, the first portion 133-1 (see FIG. 8D) of the third photoresist 133 is removed. The first portion 133-1 of the third photoresist 133 may be removed by dry process such as ashing or stripping.

As the first portion 133-1 of the third photoresist 133 is removed, the third organic functional layer 143 and the fifth conductive layer 185 are formed as patterns over the third anode 103.

Figure 8F:
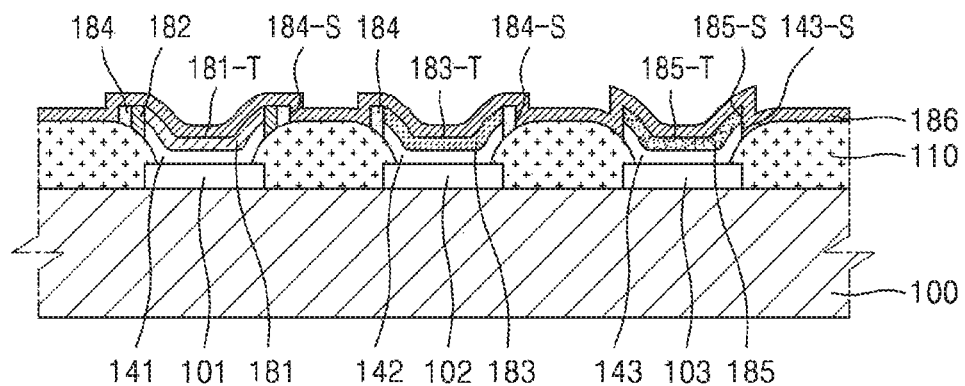

Referring to FIG. 8F, the sixth conductive layer 186 is deposited on the structure illustrated in FIG. 8E.

The sixth conductive layer 186 may include the same material as or a different material from the above-described fifth conductive layer 185.

The sixth conductive layer 186 covers a top surface 185-T of the fifth conductive layer 185 as well as side surfaces 143-S of the third organic functional layer 143 and side surfaces 185-S of the fifth conductive layer 185 over the third anode 103. The sixth conductive layer 186 covers the top surface 181-T of the first conductive layer 181 as well as the side surfaces 184-S of the fourth conductive layer 184 over the first anode 101. In addition, the sixth conductive layer 186 covers the top surface 183-T of the third conductive layer 183 as well as the side surfaces 184-S of the fourth conductive layer 184 over the second anode 102.

Figure 8G:
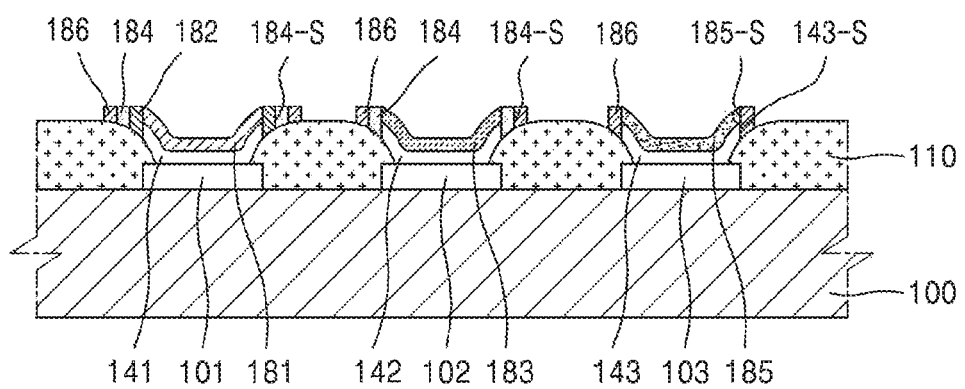

Referring to FIG. 8G, the sixth conductive layer 186 is patterned such that portions of the sixth conductive layer 186, which cover the side surfaces 184-S of the fourth conductive layer 184, are formed at a location corresponding to the first anode 101, portions of the sixth conductive layer 186, which cover the side surfaces 184-S of the fourth conductive layer 184, are formed at a location corresponding to the second anode 102, portions of the sixth conductive layer 186, which cover the side surfaces 143-S of the third organic functional layer 143 and the side surfaces 185-S of the fifth conductive layer 185, are formed at a location corresponding to the third anode 103, and the rest of the sixth conductive layer 186 is removed.

The sixth conductive layer 186 is patterned by a dry etching method. The sixth conductive layer 186 may be dry-etched by using a gas including F or Cl. By performing the dry etching method which does not use a solvent is not used, damage to a solvent of the third organic functional layer 143 may be prevented or reduced, and by performing anisotropic etching, the sixth conductive layer 186 may only disposed along the side surfaces 184-S of the fourth conductive layer 184 and the side surfaces 185-S of the fifth conductive layer 185, without increasing respective thicknesses of the first, third, and fifth conductive layers 181, 183, and 185 from the top surfaces 181-T, 183-T, and 185-T thereof.

According to the first, second, and third unit processes, in the first auxiliary cathode 150 (see FIG. 3), the second conductive layer 182, the fourth conductive layer 184, and the sixth conductive layer 186 are formed adjacent to outer portions or edges of the first conductive layer 181. In the second auxiliary cathode 160 (see FIG. 3), the fourth conductive layer 184 and the sixth conductive layer 186 are formed adjacent to outer portions or edges of the third conductive layer 183, and in the third auxiliary cathode 170 (see FIG. 3), the sixth conductive layer 186 is formed on outer portions or edges of the fifth conductive layer 185. Thus, an area of the first auxiliary cathode 150 in plan view is greater than an area of the second auxiliary cathode 160 in plan view, and the area of the second auxiliary cathode 160 in plan view is greater than an area of the third auxiliary cathode 170 in plan view.

The top surface of the third organic functional layer 143 is covered by the fifth conductive layer 185, and the side surfaces 143-S of the third organic functional layer 143 are surrounded by the sixth conductive layer 186, thereby preventing or reducing deterioration of the third organic functional layer 143 that may be caused by a subsequent process.

Figure 12:
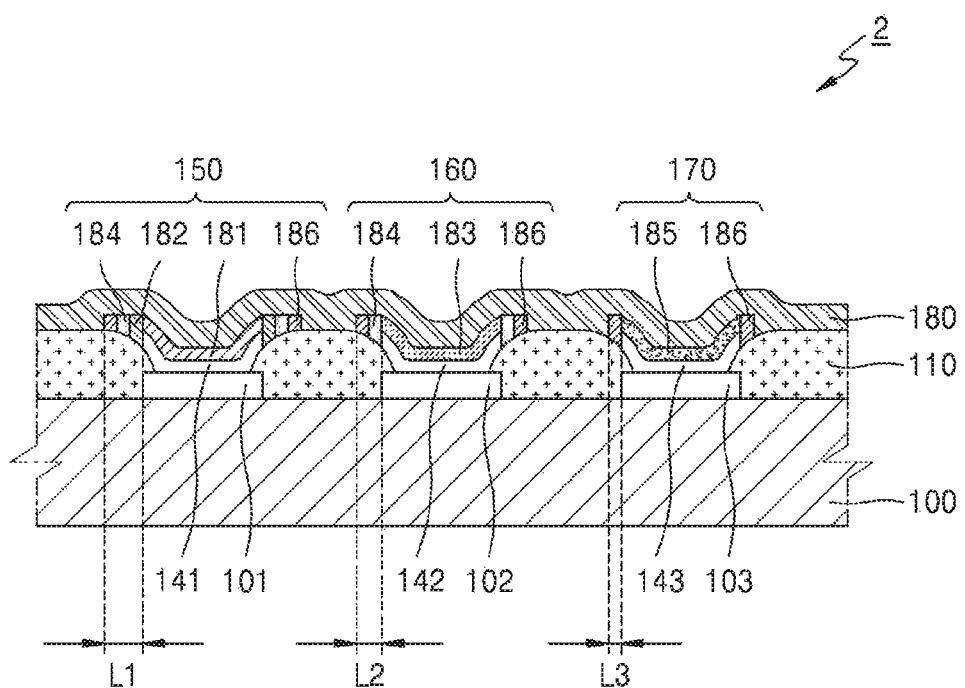
FIG. 12 is a schematic cross-sectional view of an organic light-emitting display (OLED) apparatus according to a second embodiment.

FIG. 12 is a schematic cross-sectional view of an organic light-emitting display (OLED) apparatus 2 according to a second embodiment.

Referring to FIG. 12, unlike the OLED apparatus 1 of FIG. 1, the OLED apparatus 2 further includes a cathode 180. The cathode 180 is integrally formed as a common electrode on the top surfaces and the side surfaces of the first, second, and third auxiliary cathodes 150, 160, and 170.

The cathode 180 may include the same material as or a different material from the first, second, and third auxiliary cathodes 150, 160, and 170. As described above, the first, second, and third auxiliary cathodes 150, 160, and 170 surround the side surfaces of the first, second, and third organic functional layers 141, 142, and 143 and function as barriers preventing or reducing penetration of external oxygen and moisture into the first, second, and third organic functional layers 141, 142, and 143, during the first, second, and third unit processes. The cathode 180, which is a common electrode, is deposited again on the first, second, and third organic functional layers 141, 142, and 143 so as to protect the first, second, and third organic functional layers 141, 142, and 143 and decrease a voltage drop resulting from cathode resistance.

In the present embodiment, the first, second, and third anodes 101, 102, and 103 are described as hole injection electrodes, and the first, second, and third auxiliary cathodes 150, 160, and 170 are described as electron injection electrodes. However, these descriptions are merely examples, and the exemplary embodiments are not limited thereto. Electron injection electrodes may be formed respectively at locations where the first, second, and third anodes 101, 102, and 103 are disposed, and hole injection electrodes may be formed respectively at locations where the first, second, and third auxiliary cathodes 150, 160, and 170 and the cathode 180 are disposed.

During a process of depositing an organic functional layer using a metal mask in which an opening is formed, it is difficult to apply the metal mask to an ultra-high-definition display panel because it is difficult to precisely process the metal mask due to a thickness and alignment tolerance thereof, and also it is difficult to increase the size of the metal mask due to deflection caused by a weight of the metal mask. However, according to the present embodiment, patterns of the first, second, and third organic functional layers 141, 142, and 143 are formed by a dry process and a photolithography process, not by a deposition process using a metal mask, and thus problems that may be caused by using a metal mask may be solved.

In the present embodiment, an organic functional layer and an auxiliary cathode are formed by a photolithography process and a dry process instead of a process of using an expensive fluorine-based resin or solvent, and thus manufacturing costs may be reduced by reducing costs of an expensive fluorine-based resin coating.

Hereinafter, a method of manufacturing an organic light-emitting display (OLED) apparatus according to a comparative example is described with reference to FIGS. 9A to 9E.

FIGS. 9A, 9B, 9C, 9D, and 9E are schematic cross-sectional views for explaining a first unit process of forming an OLED apparatus according to a comparative example. FIGS. 10A, 10B, 10C, 10D, and to 10E are schematic cross-sectional views for explaining a second unit process of forming the OLED apparatus according to the comparative example. FIGS. 11A, 11B, 11C, 11D, and to 11E are schematic cross-sectional views for explaining a third unit process of forming the OLED apparatus according to the comparative example.

Figure 9A:
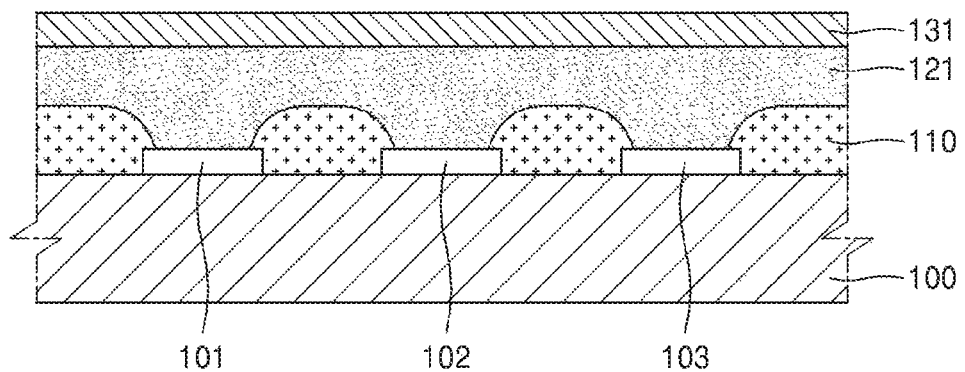
FIGS. 9A, 9B, 9C, 9D, and 9E are schematic cross-sectional views for explaining a first unit process of forming an organic light-emitting display (OLED) apparatus according to a comparative example.

Referring to FIG. 9A, a first lift-off layer 121 including a fluoropolymer is formed over the substrate 100 on which the first, second, and third anodes 101, 102, and 103 and the pixel-defining layer 110 covering end portions or edges of the first, second, and third anodes 101, 102, and 103 are formed. Then, the first photoresist 131 is formed on the first lift-off layer 121.

Figure 9B:
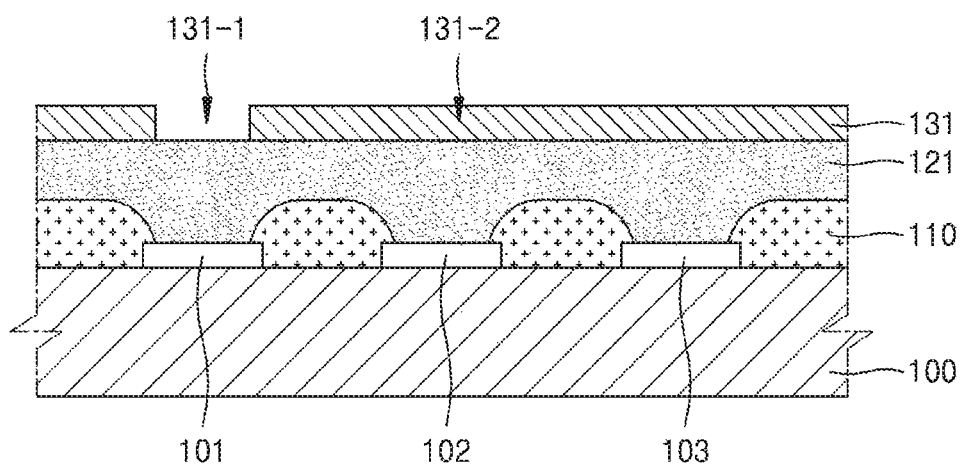

Referring to FIG. 9B, the first photoresist 131 is patterned. The first photoresist 131 is exposed and developed and then the first portion 131-1 corresponding to the first anode 101 is removed therefrom, and a second portion 131-2 other than the first portion 131-1 is formed.

Figure 9C:
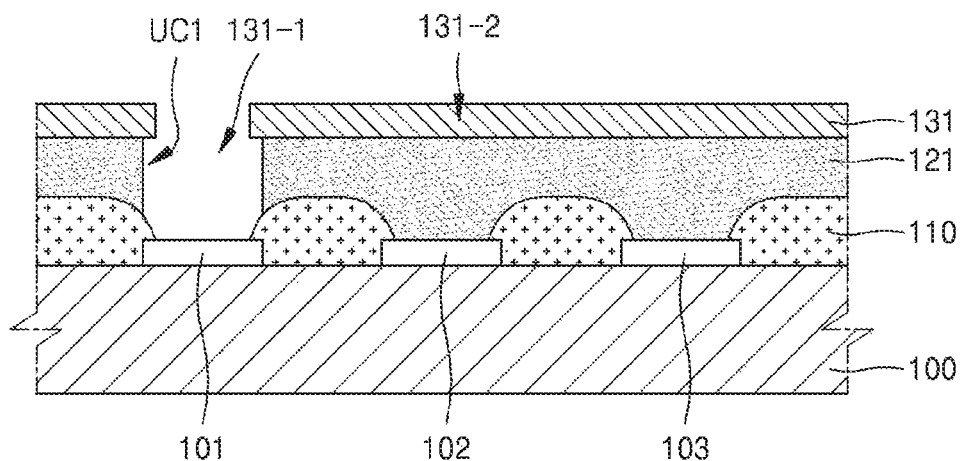

Referring to FIG. 9C, the first lift-off layer 121 is etched by using a pattern of the first photoresist 131 of FIG. 9B as an etch mask and using a first solvent including fluorine F. During the etching process, a portion of the first lift-off layer 121 disposed on the first anode 101 at a location corresponding to the first portion 131-1 is etched. The first lift-off layer 121 is etched to form a first undercut profile UC1 under a surface of a boundary of the first portion 131-1 of the first photoresist 131.

Figure 9D:
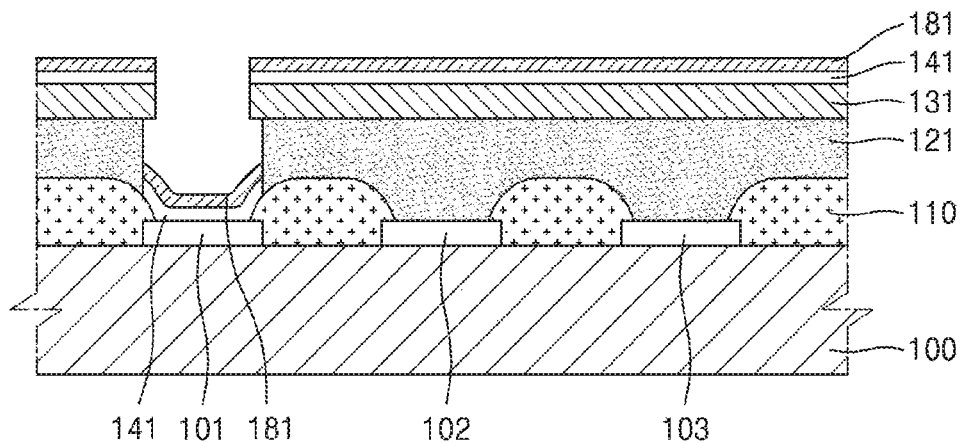

Referring to FIG. 9D, the first organic functional layer 141 and the first conductive layer 181 are sequentially formed over the structure illustrated in FIG. 9C.

Figure 9E:
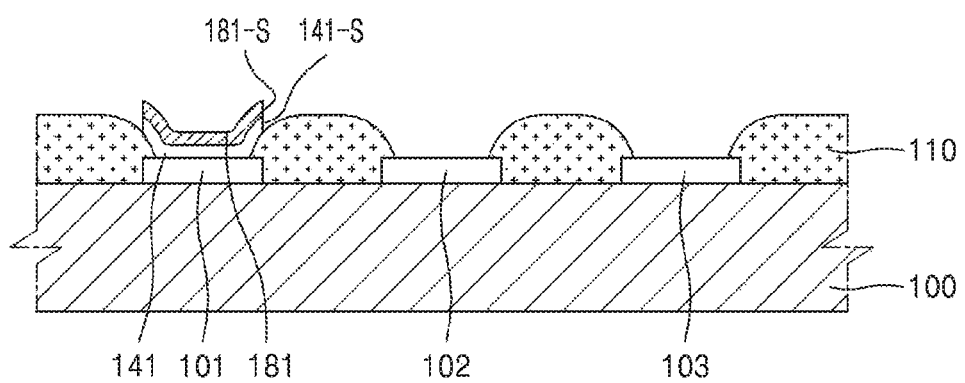

Referring to FIG. 9E, a first lift-off process is performed to entirely remove all remaining portions of the first lift-off layer 121, and accordingly, the first organic functional layer 141 and the first conductive layer 181 are formed as patterns over the first anode 101. In this case, the side surfaces 141-S of the first organic functional layer 141 and the side surfaces 181-S of the first conductive layer 181 are exposed.

After the first unit process is completed, the second unit process is performed.

Figure 10A:
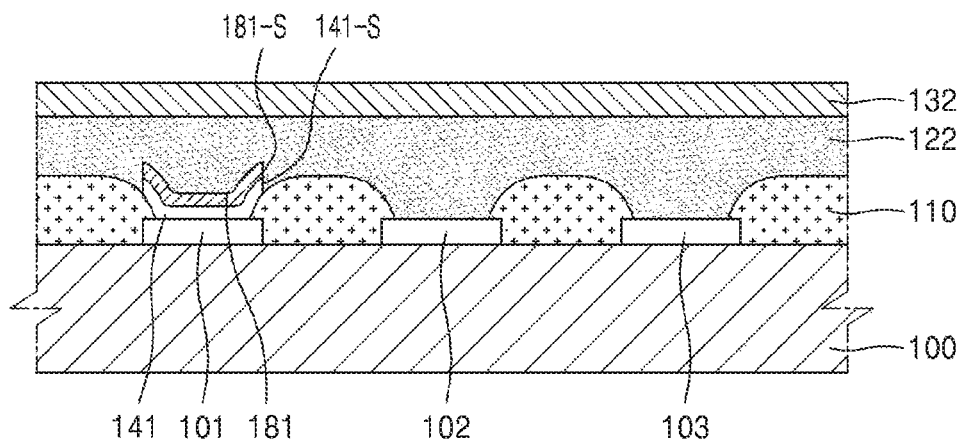
FIGS. 10A, 10B, 10C, 10D, and 10E are schematic cross-sectional views for explaining a second unit process of forming the OLED apparatus according to the comparative example.

Referring to FIG. 10A, a second lift-off layer 122 and the second photoresist 132 are sequentially formed over the structure illustrated in FIG. 9E.

The second lift-off layer 122 includes a fluoropolymer. The fluoropolymer is electrochemically stable due to its low interaction with other materials, but when the second lift-off layer 122 contacts the side surfaces 141-S of the first organic functional layer 141, the first organic functional layer 141 may be deteriorated.

Figure 10B:
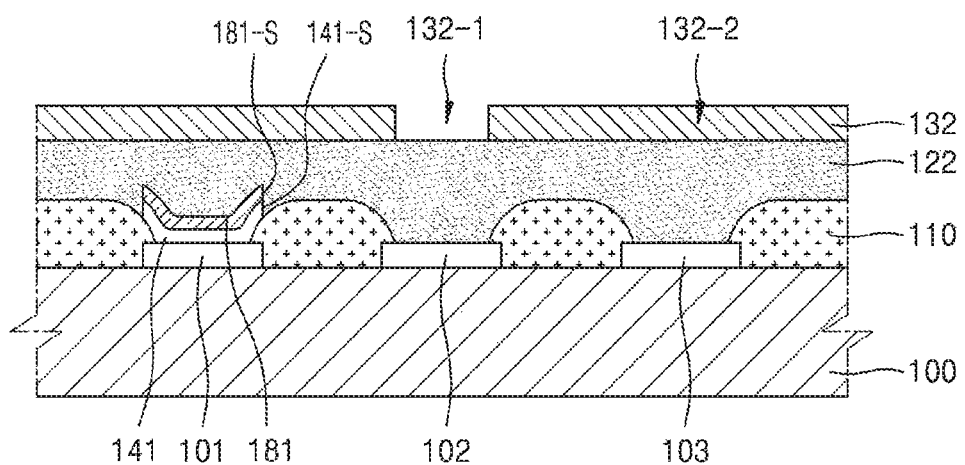

Referring to FIG. 10B, the second photoresist 132 is exposed and developed. The second photoresist 132 is patterned such that the first portion 132-1 corresponding to the second anode 102 is removed and a second portion 132-2 other than the first portion 132-1 is formed.

Figure 10C:
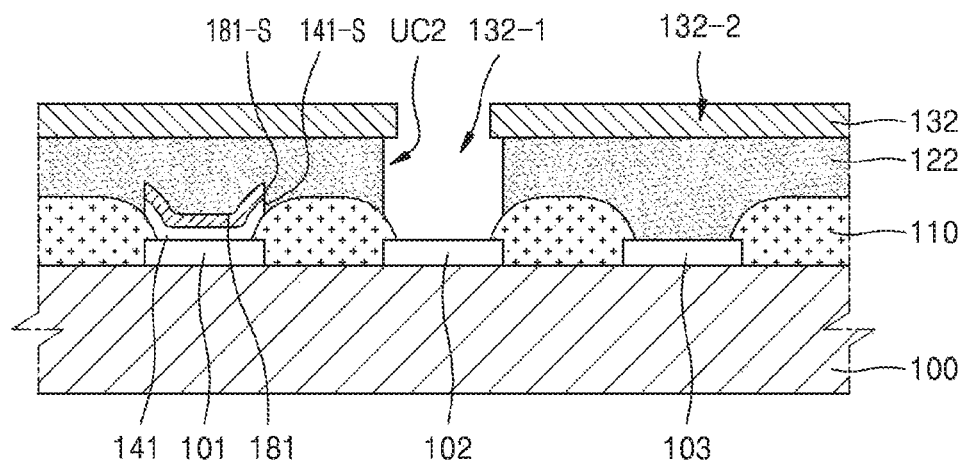

Referring to FIG. 10C, the second lift-off layer 122 is etched by using a pattern of the second photoresist 132 of FIG. 10B as an etch mask and using the first solvent including fluorine F. During the etching process, a portion of the second lift-off layer 122 disposed on the second anode 102 at a location corresponding to the first portion 132-2 is etched. The second lift-off layer 122 is etched to form a second undercut profile UC2 under a surface of a boundary of the second portion 132-2 of the second photoresist 132.

During a wet etching process using the first solvent, the first solvent is absorbed by the second lift-off layer 122, and thus delivered to the first organic functional layer 141 through the side surfaces 141-S of the first organic functional layer 141.

Figure 10D:
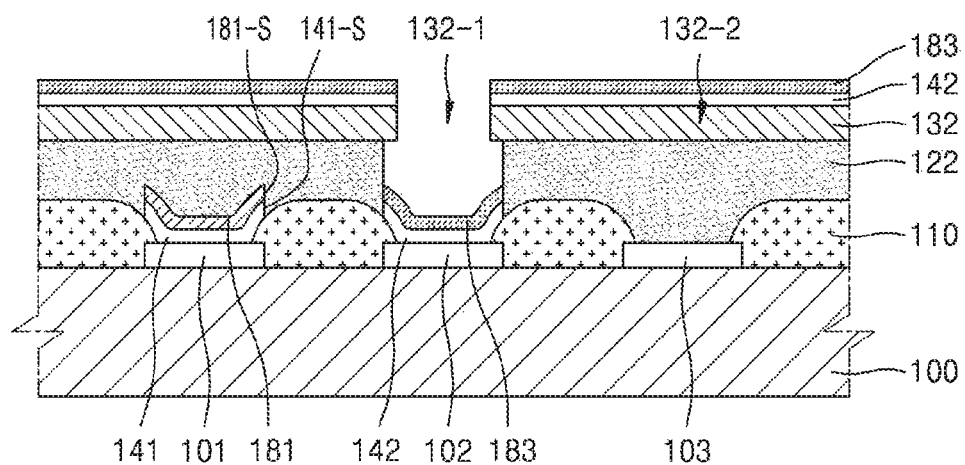

Referring to FIG. 10D, the second organic functional layer 142 and the third conductive layer 183 are sequentially formed over the structure illustrated in FIG. 10C.

Figure 10E:
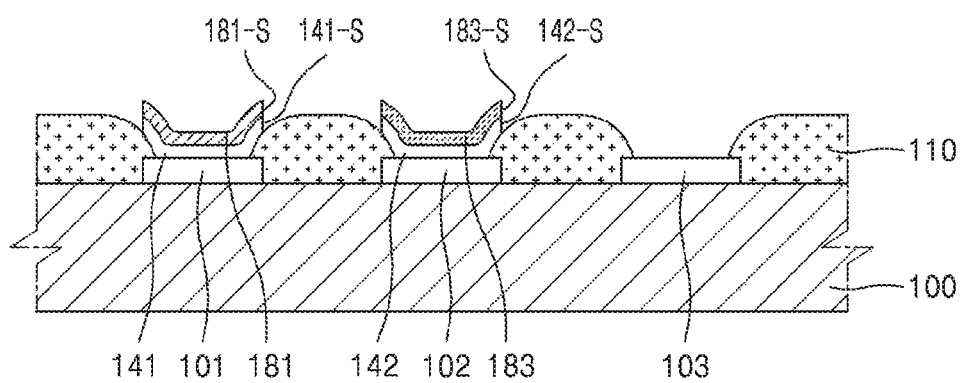

Referring to FIG. 10E, the second lift-off process is performed to entirely remove all remaining portions of the second lift-off layer 122, and accordingly the first organic functional layer 141 and the first conductive layer 181 are formed as patterns over the first anode 101, and the second organic functional layer 142 and the third conductive layer 183 are formed as patterns over the second anode 102.

In this case, the side surfaces 141-S of the first organic functional layer 141 and the side surfaces 181-S of the first conductive layer 181 are exposed. In addition, the side surfaces 142-S of the second organic functional layer 142 and the side surface 183-S of the third conductive layer 183 are exposed.

After the second unit process is completed, the third unit process is performed.

Figure 11A:
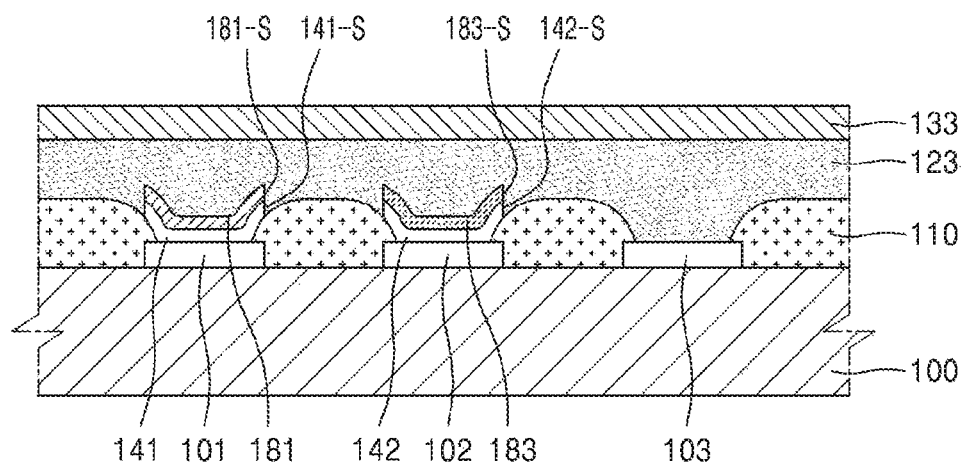
FIGS. 11A, 11B, 11C, 11D, and 11E are schematic cross-sectional views for explaining a third unit process of forming the OLED apparatus according to the comparative example.

Referring to FIG. 11A, a third lift-off layer 123 and a third photoresist 133 are sequentially formed over the structure illustrated in FIG. 10E.

The third lift-off layer 123 includes a fluoropolymer. The fluoropolymer is electrochemically stable due to its low interaction with other materials, but when the third lift-off layer 123 contacts the side surfaces 141-S of the first organic functional layer 141 and the side surfaces 142-S of the second organic functional layer 142, the first organic functional layer 141 and the second organic functional layer 142 may be deteriorated.

Figure 11B:
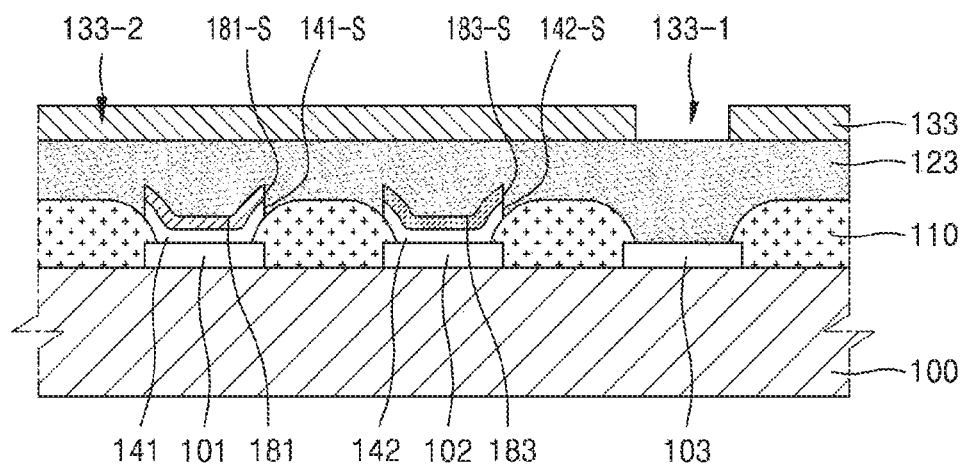

Referring to FIG. 11B, the third photoresist 133 is exposed and developed. The third photoresist 133 is patterned such that the first portion 133-1 corresponding to the third anode 103 is removed therefrom and a second portion 133-2 other than the first portion 133-1 is formed.

Figure 11C:
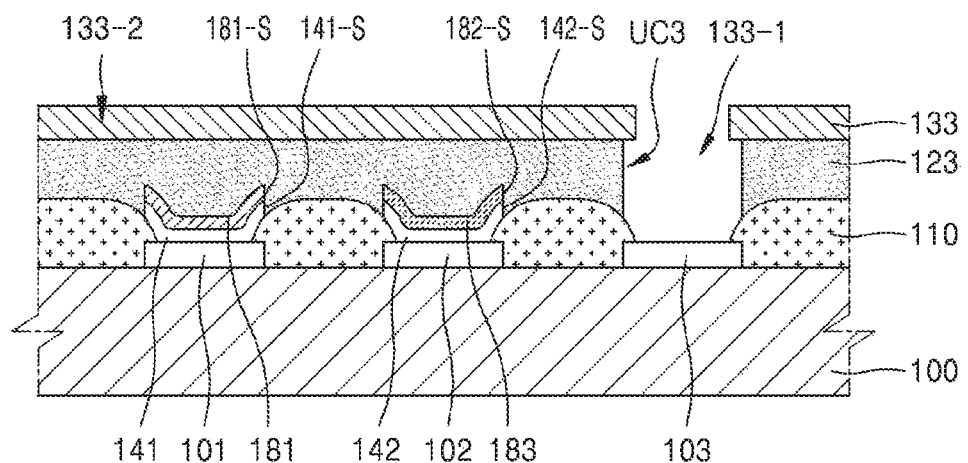

Referring to FIG. 11C, the third lift-off layer 123 is etched by using a pattern of the third photoresist 133 of FIG. 11B as an etch mask and using the first solvent including fluorine F. During the wet etching process using the first solvent, the first solvent may be absorbed by the third lift-off layer 123, and thus may be delivered to the first organic functional layer 141 and the second organic functional layer 142 through the side surfaces 141-S of the first organic functional layer 141 and the side surfaces 142-S of the second organic functional layer 142.

Figure 11D:
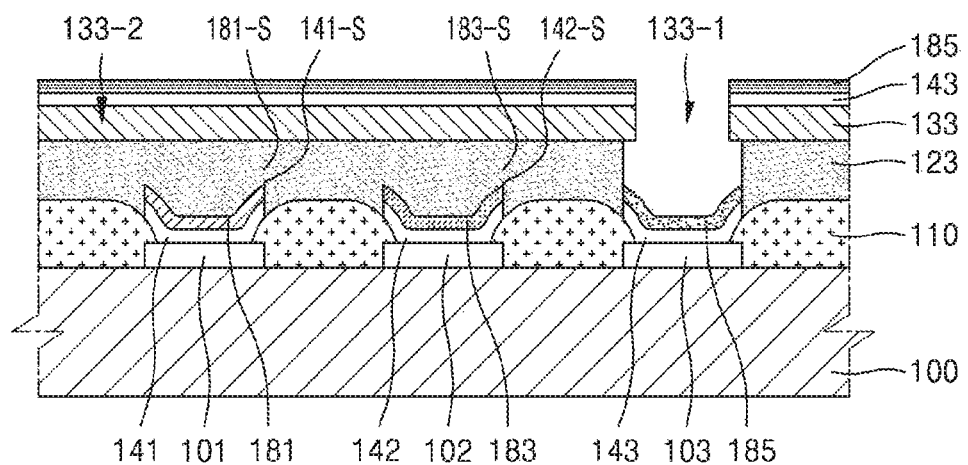

Referring to FIG. 11D, the third organic functional layer 143 and the fifth conductive layer 185 are sequentially formed over the structure illustrated in FIG. 11C.

Figure 11E:
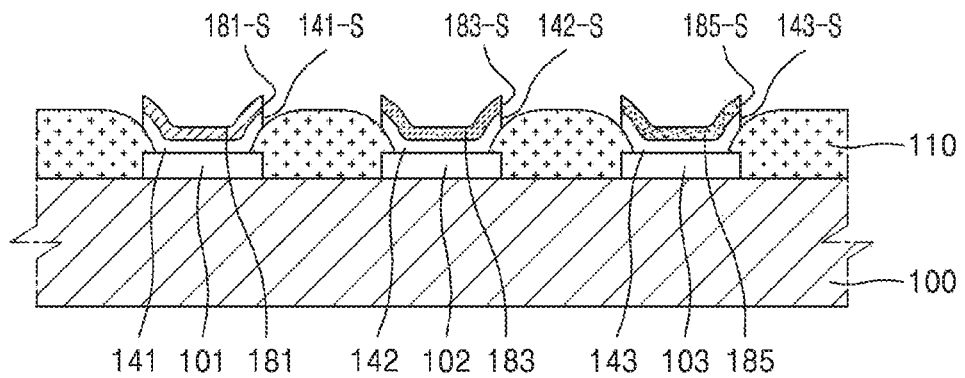

Referring to FIG. 11E, the third lift-off process is performed to entirely remove all remaining portions of the third lift-off layer 123, and accordingly, the first organic functional layer 141 and the first conductive layer 181 over the first anode 101, the second organic functional layer 142 and the third conductive layer 183 over the second anode 102, and the third organic functional layer 143 and the fifth conductive layer 185 over the third anode 103 are formed as patterns.

In this case, the side surfaces 141-S of the first organic functional layer 141 and the side surfaces 181-S of the first conductive layer 181 are exposed. In addition, the side surfaces 142-S of the second organic functional layer 142 and the side surfaces 183-S of the third conductive layer 183 are exposed. Moreover, the side surfaces 143-S of the third organic functional layer 143 and the side surfaces 185-S of the fifth conductive layer 185 are exposed.

That is, according to the method of manufacturing the OLED apparatus according to the comparative example of FIGS. 9A, 9B, 9C, 9D, and 9E, the side surfaces 141-S, 142-S, and 143-S of the first, second, and third organic functional layers 141, 142, and 143 are exposed during the first, second, and third unit processes such that the first, second, and third organic functional layers 141, 142, and 143 may be damaged due to a lift-off layer and a solvent, and as the first, second, and third lift-off processes are repeated, manufacturing costs may increase due to an increase in the use of expensive fluorine-based resin.

Although not illustrated in the drawings, the above-described OLED apparatuses may further include an encapsulation member that encapsulates an organic emission layer. The encapsulation member may include a glass substrate, a metal foil, and a thin-film encapsulation layer in which an inorganic layer and an organic layer are combined.

According to the above embodiments, since an emission layer is formed without using a fine metal mask (FMM), a high-resolution display panel may be formed.

Also, according to an exemplary embodiment, dry etching is performed instead of lift-off processing in which fluorine-based resin and a fluorine-based solvent are used, and thus damage to an organic functional layer due to the fluorine-based resin and the fluorine-based solvent may decrease such that a yield may be improved.

In addition, according to an exemplary embodiment, manufacturing costs may be reduced without using expensive fluorine-based resin.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display (OLED) apparatus, comprising:
    a first electrode;
    a second electrode disposed separate from the first electrode;
    a pixel-defining layer covering an edge of the first electrode and an edge of the second electrode;
    a first organic functional layer disposed on the first electrode and the pixel-defining layer, the first organic functional layer comprising a first emission layer;
    a first opposing electrode covering a top surface and enclosing an outer circumference of side surfaces of the first organic functional layer;
    a second organic functional layer disposed on the second electrode and the pixel-defining layer, the second organic functional layer comprising a second emission layer; and
    a second opposing electrode covering a top surface and enclosing an outer circumference of side surfaces of the second organic functional layer,
    wherein an area of the first opposing electrode in contact with the pixel-defining layer is greater than an area of the second opposing electrode in contact with the pixel-defining layer.

2. The OLED apparatus of claim 1, wherein a first color of light emitted from the first emission layer is different from a second color of light emitted from the second emission layer.

3. The OLED apparatus of claim 1, wherein each of the first organic functional layer and the second organic functional layer comprises at least one layer selected from the group consisting of a hole injection layer, a hole transport layer, an electron injection layer, and an electron transport layer.

4. The OLED apparatus of claim 1, wherein a thickness of a portion of the first opposing electrode covering the top surface of the first organic functional layer is as same as a thickness of a portion of the second opposing electrode covering the top surface of the second organic functional layer.

5. The OLED apparatus of claim 1, wherein the pixel-defining layer comprises an insulating layer.

6. The OLED apparatus of claim 5, wherein an edge of the first organic functional layer and an edge of the second organic functional layer are disposed on an inclined surface of the pixel-defining layer.

7. The OLED apparatus of claim 1, further comprising a common electrode that is commonly and integrally disposed on the first opposing electrode and the second opposing electrode.

8. The OLED apparatus of claim 7, wherein the common electrode covers side surfaces of the first opposing electrode and side surfaces of the second opposing electrode.

9. The OLED apparatus of claim 1, further comprising:
    a third electrode disposed separate from the first electrode and the second electrode;
    a third organic functional layer disposed on the third electrode, the third organic functional layer comprising a third emission layer; and
    a third opposing electrode covering a top surface and enclosing an outer circumference of side surfaces of the third organic functional layer,
    wherein the pixel-defining layer further covers an edge of the third electrode, and
    wherein an area of the second opposing electrode in contact with the pixel-defining layer is greater than an area of the third opposing electrode in contact with the pixel-defining layer.

10. The OLED apparatus of claim 9, wherein a first color of light emitted from the first emission layer, a second color of light emitted from the second emission layer, and a third color of light emitted from the third emission layer are different from one another.

11. An organic light-emitting display (OLED) apparatus, comprising:
    a first electrode;
    a first organic functional layer disposed on the first electrode, the first organic functional layer comprising a first emission layer;
    a first opposing electrode comprising a first conductive layer covering a top surface of the first organic functional layer, a second conductive layer surrounding side surfaces of the first organic functional layer, a third conductive layer surrounding side surfaces of the second conductive layer, and a fourth conductive layer surrounding side surfaces of the third conductive layer;
    a second electrode disposed separate from the first electrode;
    a second organic functional layer disposed on the second electrode, the second organic functional layer comprising a second emission layer; and
    a second opposing electrode comprising a fifth conductive layer covering a top surface of the second organic functional layer, a sixth conductive layer surrounding side surfaces of the second organic functional layer, and a seventh conductive layer surrounding side surfaces of the sixth conductive layer.

12. The OLED apparatus of claim 11, wherein, in a plan view, an area of the first opposing electrode is greater than an area of the second opposing electrode.

13. The OLED apparatus of claim 11, wherein the material of the third conductive layer is the same as that of the sixth conductive layer.

14. The OLED apparatus of claim 11, further comprising a pixel-defining layer comprising an insulating layer, the pixel-defining layer covering an edge of the first electrode and an edge of the second electrode.

15. The OLED apparatus of claim 14, wherein an edge of the first organic functional layer and an edge of the second organic functional layer are disposed on an inclined surface of the pixel-defining layer.

16. The OLED apparatus of claim 11, further comprising a common electrode that is commonly and integrally disposed on the first opposing electrode and the second opposing electrode.

17. The OLED apparatus of claim 16, wherein the common electrode covers side surfaces of the first opposing electrode and side surfaces of the second opposing electrode.

18. The OLED apparatus of claim 11, further comprising:
a third electrode disposed separate from the first electrode and the second electrode;
a third organic functional layer disposed on the third electrode, the third organic functional layer comprising a third emission layer; and
a third opposing electrode comprising an eighth conductive layer covering a top surface of the third organic functional layer, and a ninth conductive layer surrounding side surfaces of the third organic functional layer.

19. The OLED apparatus of claim 18, wherein the material of the ninth conductive layer is the same as those of the forth conductive layer and the seventh conductive layer.

* * * * *